United States Patent
Oshima et al.

(10) Patent No.: US 8,004,445 B2
(45) Date of Patent: Aug. 23, 2011

(54) DIGITAL CALIBRATION TYPE ANALOG-TO-DIGITAL CONVERTER AND WIRELESS RECEIVER CIRCUIT AND WIRELESS TRANSCEIVER CIRCUIT USING THE SAME

(75) Inventors: Takashi Oshima, Moriya (JP); Taizo Yamawaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/720,669

(22) Filed: Mar. 10, 2010

(65) Prior Publication Data

US 2010/0164767 A1 Jul. 1, 2010

Related U.S. Application Data

(63) Continuation of application No. 12/244,971, filed on Oct. 3, 2008, now Pat. No. 7,701,376.

(30) Foreign Application Priority Data

Oct. 3, 2007 (JP) ................................ 2007-259856

(51) Int. Cl.
H03M 1/34 (2006.01)
(52) U.S. Cl. ........................................ 341/158; 341/159
(58) Field of Classification Search .................. 341/159, 341/158, 155, 156, 118, 120, 126, 123
See application file for complete search history.

(56) References Cited

U.S. PATENT DOCUMENTS 6,674,379 B1 * 1/2004 Li et al. .......................... 341/123

FOREIGN PATENT DOCUMENTS

JP 06-291658 A 10/1994

OTHER PUBLICATIONS

A. N. Karanicolas et al., "A 15-b 1-Msample/s Digitally Self-Calibrated Pipeline ADC," IEEE Journal of Solid-State Circuits, Vo. 28, No. 12, pp. 1207-1215 (1993).
Y. S. Shu et al., "A 15b-Linear, 20MS/s, 1.5b/Stage Pipelined ADC" Digitally Calibrated with Signal-Dependent Dithering, 2006 Symposium on VLSI Circuits Digest of Technical Papers (2006).
Y. Chiu et al., "Least Mean Square Adaptive Digital Background Calibration of Pipelined Analog-to-Digital Converters," IEEE Transactions on Circuits and Systems—I: Regular Papers, vol. 51, No. 1, pp. 38-46 (2004).
Takashi Ohshima et al., "Fast Digital Background Calibration for Pipelined A/D Converters," The Institute of Electronics, Information and Communication Engineers, IEICE Technical Report, VLD 2006-138 (2007).

* cited by examiner

Primary Examiner — Joseph Lauture
(74) Attorney, Agent, or Firm — Miles & Stockbridge P.C.

(57) ABSTRACT

In a wireless chip receiving the multi-rate data according to the related art, power consumption and a circuit area of an analog-to-digital converter become large. In a digital calibration type analog-to-digital converter including both a reference analog-to-digital conversion unit and a main analog-to-digital conversion unit, when processing the high-sample rate wireless receive signal, both the reference analog-to-digital conversion unit and the main analog-to-digital conversion unit are operated to configure a general digital calibration type analog-to-digital converter, and when processing a low-sample rate wireless receive signal, analog-to-digital conversion is performed by using the reference analog-to-digital conversion unit and operations of the main analog-to-digital conversion unit or the like are stopped to remarkably reduce power consumption.

5 Claims, 25 Drawing Sheets

US 8,004,445 B2

DIGITAL CALIBRATION TYPE ANALOG-TO-DIGITAL CONVERTER AND WIRELESS RECEIVER CIRCUIT AND WIRELESS TRANSCEIVER CIRCUIT USING THE SAME

CROSS-REFERENCE TO RELATED APPLICATION

This application is a continuation of application ser. No. 12/244,971 filed Oct. 3, 2008 now U.S. Pat. No. 7,701,376. The present application also claims priority from Japanese Patent Application 2007-259856 filed on Oct. 3, 2007, the content of which is hereby incorporated by reference into this application.

FIELD OF THE INVENTION

The present invention relates to a digital calibration type analog-to-digital converter and a wireless receiver circuit and a wireless transceiver circuit using the same, and in particular, to a digital calibration type analog-to-digital converter and a wireless receiver circuit and a wireless transceiver circuit using the same that are capable of receiving signals transmitted at plural data rates.

BACKGROUND OF THE INVENTION

A. N. Karanicolas et al., "A 15-b 1-MSample/s Digitally Self-Calibrated Pipeline ADC," IEEE Journal of Solid-State Circuits Vol. 28, No. 12, pp. 1207-1215 (1993) discloses a digital calibration type analog-to-digital converter as a unit that can realize a high-sample rate and high-resolution analog-to-digital converter while using low power consumption. Further, Y. Shu (Y. S. Shu et al., A 15b-Linear, 20MS/s, 1.5b/Stage Pipelined ADC Digitally Calibrated with Signal-Dependent Dithering, 2006 Symposia on VLSI Technology and VLSI Circuits Session C25-1 (2006) discloses a digital calibration type analog-to-digital converter according to a scheme that uses pseudo-random signals when performing the calibration. In addition, Yun Chiu (Y. Chiu et al., "Least Mean Square Adaptive Digital Background Calibration of Pipelined Analog-to-Digital Converters," IEEE Transactions on Circuits and Systems I Vol. 51, PP. 38-46 (2004) or Takashi Ohshima, Fast Digital Background Calibration for Pipelined A/D Converters, Institute of Electronics, Information and Communication, Technical Report of IEICE VLD 2006-138, (2007) discloses a digital calibration type analog-to-digital converter including a reference analog-to-digital converter. Just like the Yun Chiu or the Takashi Ohshima, JP-A-Hei6(1994)-291658 discloses a digital correction type analog-to-digital converter having a high-speed low-precision analog-to-digital converter (ADC) and a low-speed high-precision ADC, which is another scheme.

The A/D converter disclosed in JP-A-Hei6(1994)-291658 includes a high-speed low-precision ADC 10, a low-speed high-precision ADC 11, a data generation unit 12, a clock generator 13, and a divider 14 as shown in FIG. 24. The data generation unit 12 is configured so that a high-precision sampling data are selected at a timing when high-precision sampling data are output from the low-speed high-precision ADC 11, interpolation data are generated based on outputs from the low-speed high-precision ADC 11 at other timings, and the interpolation data or the low-precision sampling data from the high-speed low precision ADC 10 are selected.

SUMMARY OF THE INVENTION

In order to realize a dual sample rate ADC that can perform a high sample rate operation for a wireless transceiver circuit capable of receiving signals transmitted at plural data rates, for example, a wireless LAN and a low sample rate operation for a mobile phone, the related art needs two separate ADCs.

In the future, a WLAN system or a cellular system will process signals having a data rate above several hundreds of Mbps. In this case, it is required the sample rate be above several hundreds of MS/s as well as having resolution above 12 bits.

It is assumed that the wireless transceiver circuit, which can receive the signals transmitted at the plural data rates, adopts, as a high-speed type ADC for a high data rate, a high-sample rate and high-resolution analog-to-digital converter that does not perform digital calibration as it is. In this case, for the high data rate transmission, power consumption of the high-sample rate and high-resolution ADC is above 1 W, resulting in remarkably shortening the battery lifetime. Further, if two pairs of A/D converters configured of a high-speed type ADC for a high data rate and a low-speed type ADC for a low data rate are required, a circuit area becomes large.

However, it may be considered that the one high-sample rate and high-resolution analog-to-digital converter can be provided without using two separate analog-to-digital converters for both schemes of a high data rate and a low data rate. As a result, the received signals of all the data rates can be processed by the high-sample rate and high-resolution analog-to-digital converter. Although, in this case, power consumption becomes large even when data rate is low, as well as when the data rate is high. In other words, power consumption is not scalable in connection with the data rate, which is a large problem in the design of a wireless system.

On the other hand, the A. N. Karanicolas et al., the Y. S. Shu et al., Y. Chiu et al., and Takashi Ohshima et al. disclose the digital calibration type analog-to-digital converter as a unit that can realize the high-sample rate and high-resolution analog-to-digital converter for a high data rate while using low power consumption.

FIG. 25 shows an example of a case where the digital calibration type analog-to-digital converter is adopted as the analog-to-digital converter for a high sample rate.

Signals input from an analog 21 are amplified in a high frequency circuit unit 22, which are in turn multiplied by local oscillation signals generated from a voltage controlled oscillator 24 and a phase synchronization loop 25 by means of a frequency conversion circuit 23 to be frequency-converted into a low-intermediate frequency (or, zero frequency; hereinafter, referred to a baseband signal). Interference wave components of the intermediate frequency signal or the baseband signal are removed in a filter 26, which are in turn amplified in a variable gain amplifier 27 and input to a digital calibration type analog-to-digital converter 29. The signals digitized by the analog-to-digital converter 29 are demodulated in a demodulation unit 212, which are in turn subjected to an upper layer process, or the like, by a baseband signal processing unit 213.

Assuming that the digital calibration type analog-to-digital converter in the related art is adopted in the wireless transceiver circuit capable of receiving the signals transmitted at the plural data rates, the follow problems occur. First, in the case where the digital calibration type analog-to-digital converter disclosed in the A. N. Karanicolas et al. is adopted in the wireless transceiver circuit, it has problems in that a training time should be prepared separately before an arrival of a packet signal so as to perform the calibration between the times. Thus, the system becomes complicated or if the calibration is not performed during the reception of the packet signal, the digital calibration type analog-to-digital converter is vulnerable to a fluctuation in temperature or power supply voltage.

Further, in the case where the digital calibration type analog-to-digital converter disclosed in the Y. S. Shu et al. is adopted in the wireless transceiver circuit, it has problems in that a convergence time of calibration is long, that is, a training time should be prepared separately before an arrival of a packet signal so as to perform the calibration between the times. Thus, the system is complicated or if an algorithm of calibration is complicated, the area and power consumption of the digital circuit, which executes the algorithm, becomes large.

Also, the digital calibration type analog-to-digital converter disclosed in the Y. Chiu et al. or Takashi Ohshima et al. can avoid the above-mentioned problems because the convergence time of the calibration is fast and the algorithm of calibration is simple. However, since a separate analog-to-digital converter for reference is needed, it has a problem in that the circuit area becomes large.

Moreover, the ADC having the configuration disclosed in JP-A-Hei6(1994)-291658 performs the output correction using data interpolation, the above document actually limits the possibility of achieving resolution.

It is an object of the present invention to provide a digital calibration type analog-to-digital converter and a wireless receiver circuit and a wireless transceiver circuit using the same, which can receive signals transmitted at plural data rates, be suited for a high-speed data transmission requiring a high sample rate or a high resolution, and prevent an increase in power consumption or circuit area.

One of typical aspects of the present invention provides a digital calibration type analog-to-digital converter comprising: a first analog-to-digital conversion unit, a second analog-to-digital conversion unit, a digital calibration section that calibrates an output from the first analog-to-digital conversion unit, and a switching control section that is controlled by identification information, wherein the first analog-to-digital conversion unit corresponds to a high sample rate at low precision and the second analog-to-digital conversion unit corresponding to a low sample rate at high precision, wherein, when the identification information displays a state of receiving a high-data rate signal, the switching control section operates the first analog-to-digital conversion unit, the second analog-to-digital conversion unit, and the digital calibration section so as to perform an analog-to-digital conversion, and wherein, when the identification information displays a state of receiving a low-data rate signal, the switching control section stops operations of the first analog-to-digital conversion unit and the digital calibration section and allows the second analog-to-digital converter to perform the analog-to-digital conversion.

With the present invention, the dual sample rate analog-to-digital converter can be realized by one digital calibration type analog-to-digital converter, making it possible to remarkably reduce an area occupied by a chip of a wireless receiver circuit and a wireless transceiver circuit and to remarkably reduce power consumption.

DETAILED DESCRIPTION OF THE PREFERRED EMBODIMENTS

According to a representative embodiment of the present invention, in order to process a wireless receive signal of a multi sample rate, a wireless transceiver circuit having at least one digital calibration type analog-to-digital converter, which includes a reference analog-to-digital converter and a main analog-to-digital converter (hereinafter, referred to a main analog-to-digital converter) is provided. Each digital calibration type analog-to-digital converter is configured as a general digital calibration type high-sample rate and high-resolution analog-to-digital converter which operates both the reference analog-to-digital converter and the main analog-to-digital converter when processing the high-sample rate wireless receive signal, while it performs an analog-to-digital conversion using the reference analog-to-digital converter and stops the operation of the main analog-to-digital converter, or the like when processing a wireless receive signal of a low sample rate, thereby reducing power consumption.

Compared to a case where the high-sample rate high-resolution analog-to-digital converter that does not perform the digital calibration, power consumption can remarkably reduced by performing the present invention. Further, unlike a case where two separate ADCs of a high speed type and a low speed type are adopted, the present invention does not need a separate low-sample rate and high-resolution analog-to-digital converter for processing a low-data rate wireless receive signal, making it possible to remarkably reduce a circuit area.

In particular, in a system on a chip (SOC) or an RF-IC, the present invention increases a degree of freedom in the layout of other circuit blocks by reducing the circuit area of the analog-to-digital converter, such that the overall characteristics of a receiver can be expected to be improved. Further, the present invention stops the operation of the high-sample rate main ADC when processing the low-data rate wireless receive signal, such that an effect of a high frequency clock signal, which is an operation clock of the ADC or a harmonic wave of the ADC on an RF circuit unit or an IF circuit unit through a coupling between power supply lines or wirings can be reduced, thereby advantageously achieving in view of the size, performance, and power consumption, a wireless communication system.

First Embodiment

A basic configuration of a receiver circuit in a wireless transceiver circuit including an analog-to-digital converter according to a first embodiment of the present invention will first be described with reference to FIGS. 1 to 4.

Figure 1:
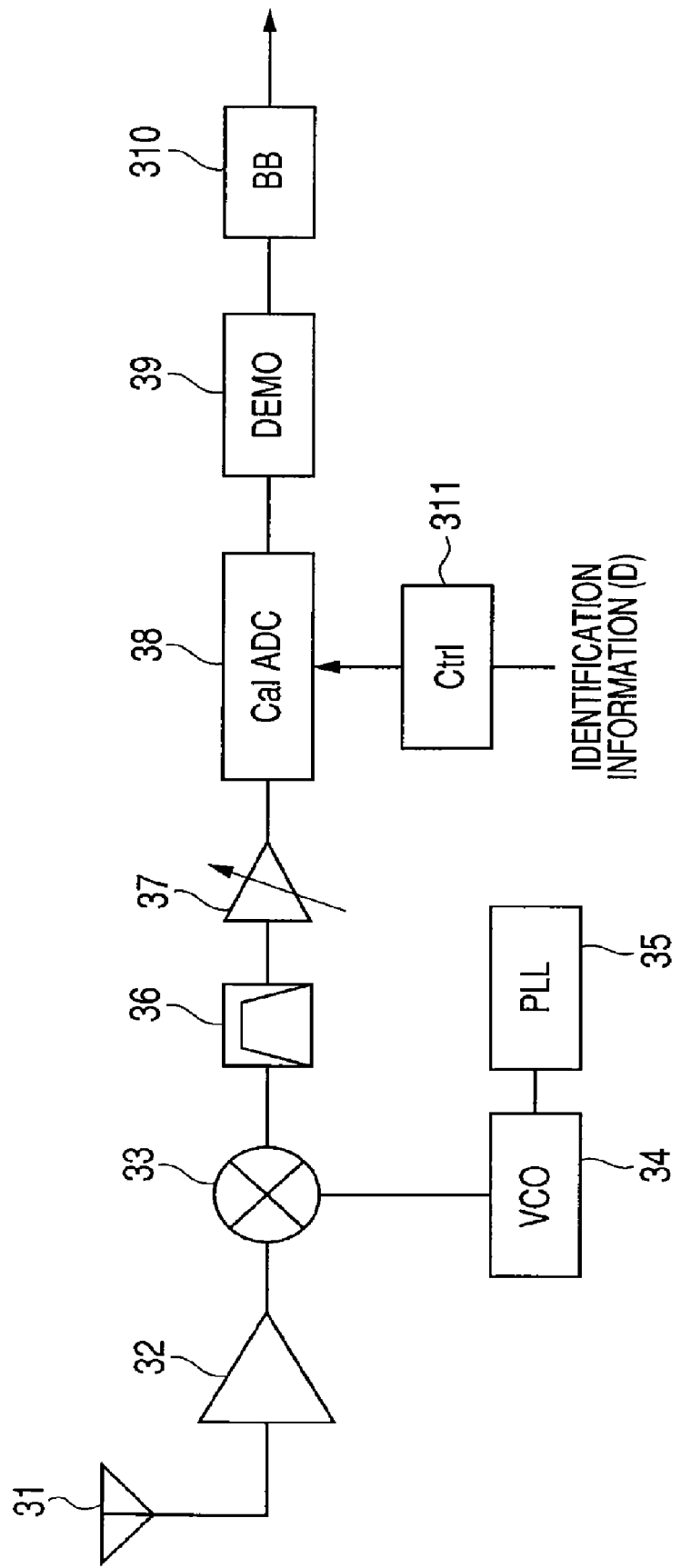
FIG. 1 is a view showing an entire circuit configuration of a receiver circuit in a wireless transceiver circuit according to a first embodiment of the present invention.

FIG. 1 shows an entire circuit configuration of the receiver circuit in the wireless transceiver circuit according to the first embodiment. In FIG. 1, signals input from an antenna 31 are amplified in a high frequency amplification unit 32, which are in turn multiplied by local oscillation signals generated from a voltage controlled oscillator 34 and a phase synchronization loop 35 by means of a frequency conversion circuit 33 to be frequency-converted into a low-intermediate frequency (or, zero frequency). Interference wave components of the intermediate frequency signal or the baseband signal are removed in a filter 36, which are in turn amplified in a variable gain amplifier 37 and input to one digital calibration type analog-to-digital converter 38. The signals digitized by the digital calibration type analog-to-digital converter 38 are demodulated in a demodulation unit 39, which are in turn subjected to an upper layer process, etc., by a baseband signal processing unit 310.

The digital calibration type analog-to-digital converter 38 is switch-controlled by a control signal Ctrl provided from a switching control section 311 on the basis of the identification information (D) that holds information, such as the kinds of currently received signals, data rate, or the like. Further, a method of obtaining the identification information (D) will be described in more detail below.

Figure 2:
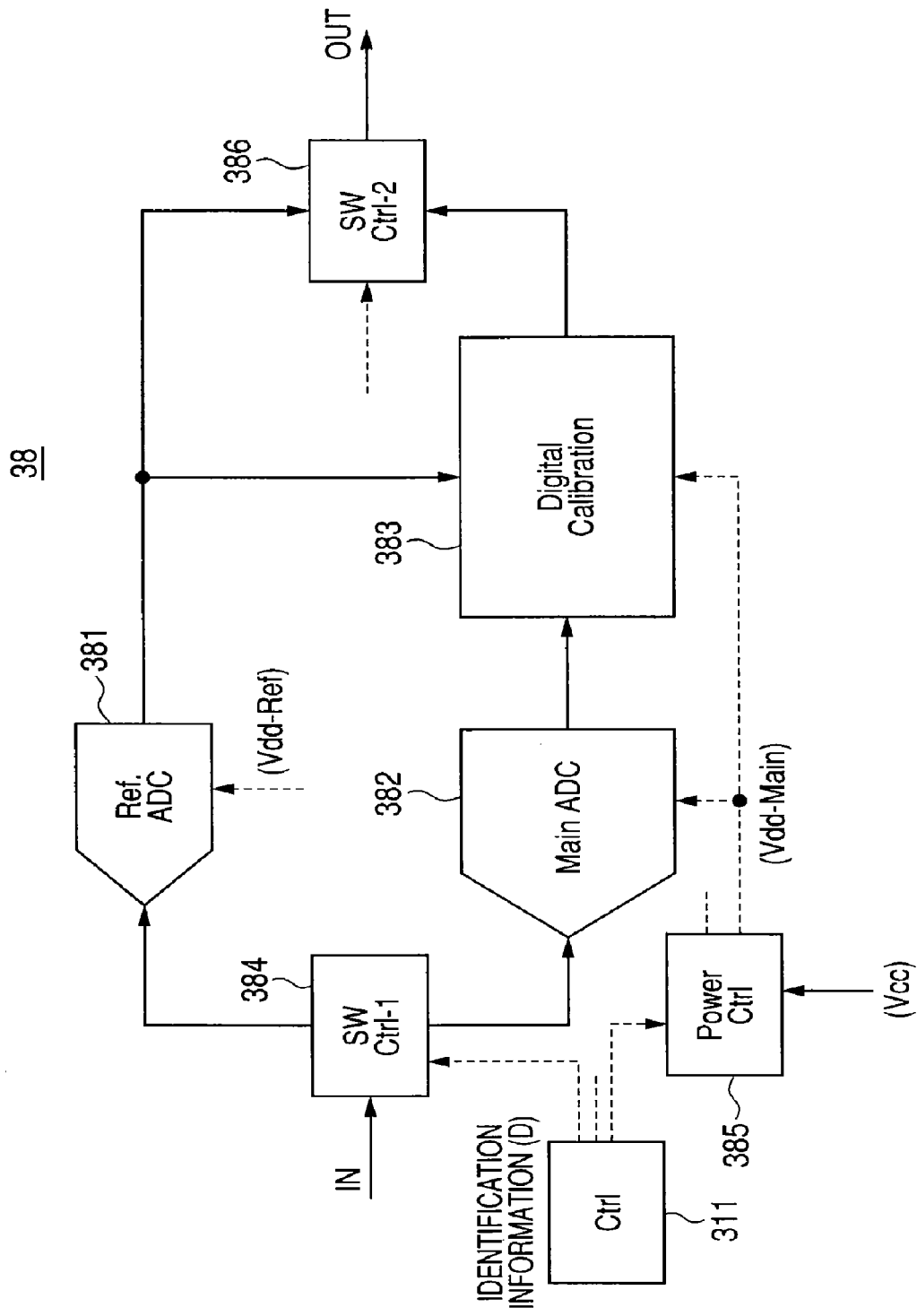
FIG. 2 is a view showing a schematic configuration of a digital calibration type analog-to-digital converter according to the first embodiment.

FIG. 2 schematically shows a configuration of the digital calibration type analog-to-digital converter 38 according to the first embodiment. An input analog voltage is applied to a main analog-to-digital conversion unit 382 (a first analog-to-digital conversion unit) and a reference analog-to-digital conversion unit 381 (a second analog-to-digital conversion unit), respectively, via a switch (SWctrl-1) 384 for switching an input-side ADC. The main analog-to-digital conversion unit corresponds to a high sample rate at low precision and is operated at a sufficiently high sample rate, which can process high-data rate wireless signals. On the other hand, the reference analog-to-digital conversion unit corresponds to a low sample rate at high precision and is operated at an extent capable of processing low-data rate wireless signals, that is, a sufficiently delayed sample rate, as compared to the main analog-to-digital conversion unit 382.

An output from the main analog-to-digital conversion unit 382 and an output from the reference analog-to-digital conversion unit 381 are applied to a digital calibration section 383. Any one of the two outputs, which are the output from the reference analog-to-digital conversion unit 381 and the output from the main analog-to-digital conversion unit 382 via the digital calibration section 383, is selected by a switch (SWCtrl-2) 386 for switching an output-side ADC, which is a digital output from the digital calibration type analog-to-digital conversion unit 38. Switches 384 and 386 for switching input/output-side ADCs are controlled by an output signal from the switching control section 311. A power supply switching control section 385 is also controlled by an output signal from the switching control section 311. In other words, the power supply switching control section 385 is operated according to the data rate, or the like, such that the power supply voltages from the main analog-to-digital conversion unit 382 and the digital calibration section 383 are on-off controlled by VDDctrl_Main and the power supply voltage from the reference analog-to-digital conversion unit 381 is controlled by VDDctrl_Ref.

The switching control section 311 operates the digital calibration type analog-to-digital converter 38 as a general digital calibration type analog-to-digital converter when receiving the high-data rate signal and operates the digital calibration type analog-to-digital converter 38 as a low-speed power saving type analog-to-digital converter when receiving the low data rate signal.

Referring back to FIG. 1, gain by the variable gain amplifier 37 is automatically set so that amplitude of the output voltage of the variable gain amplifier is equal to or less than an input dynamic range of the digital calibration type analog-to-digital converter 38. The signals digitized by the digital calibration type analog-to-digital converter 38 are demodulated in a demodulation unit 39, which are in turn subjected to an upper layer process by a baseband signal processing unit 310. The filter 36 is implemented by a band pass filter based on an intermediate frequency when the intermediate frequency is not zero and is implemented by a low pass filter when the intermediate frequency is zero (a case of direct conversion).

Figure 3:
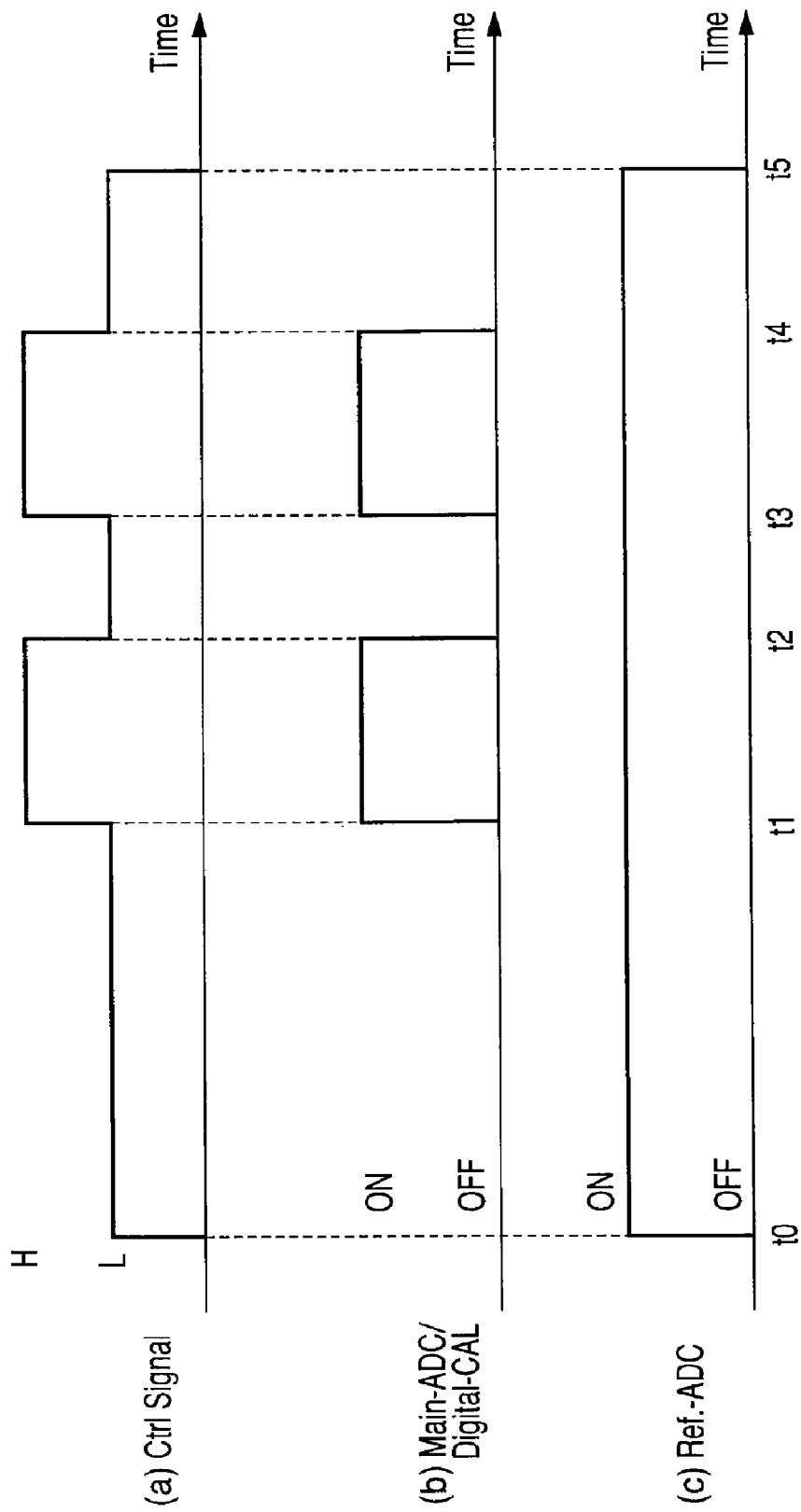
FIG. 3 is a timing chart showing an operation of the digital calibration type analog-to-digital converter according to the first embodiment.
Figure 4:
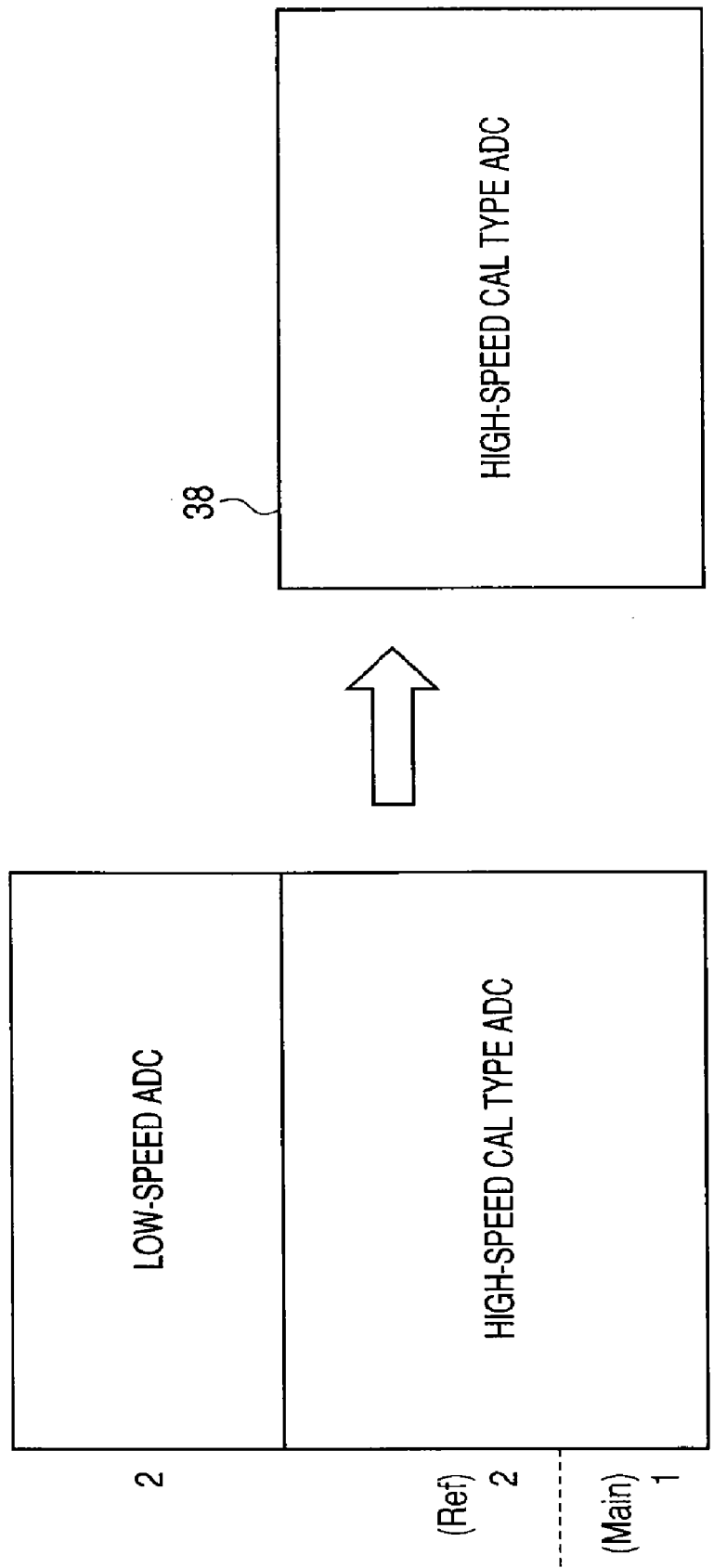
FIG. 4 is a view showing an effect of the present invention.

FIG. 3 is a timing chart showing the operation of the digital calibration type analog-to-digital converter 38 according to the first embodiment. In low data rates t0-t1, t2-t3, and t4-t5, the control signal Ctrl based on the identification information (D) is L and the reference analog-to digital conversion unit 381 is powered-on, thereby performing the analog-to digital conversion and the main analog-to digital conversion unit 382 or the digital calibration section 383 is powered-down between low data rates so as to reduce power consumption. On the other hand, in high data rates t1-t2, and t3-t4, the control signal Ctrl is H and the main analog-to digital conversion unit 382 or the digital calibration section 383 is also powered-on to perform a function of the general digital calibration type analog-to digital converter. At this time, the reference analog-to digital conversion unit 381 is used to perform the digital calibration of the main analog-to-digital conversion unit 382. Further, in a time zone (after t5) where it becomes apparent from the identification information (D) that no received signals are reached, the control signal Ctrl is 0 and all the reference analog-to digital conversion unit, the main analog-to digital conversion unit, and the digital calibration section are powered-down.

According to the first embodiment as described above, in the Cal type analog-to-digital converter having the main analog-to-digital conversion unit and the reference analog-to digital conversion unit, both the main analog-to digital conversion unit and the reference analog-to digital conversion unit are operated as the general Cal type analog-to-digital converter in a high sample rate, while in a low sample rate, the operation of the main analog-to-digital conversion unit stops and the reference analog-to-digital conversion unit is instead operated, such that one Cal type analog-to-digital converter can be operated corresponding to the dual rate.

Compared to the case where the received signals of a high-sample rate and a low data rate are processed together by the one high-sample rate and high-resolution digital calibration analog-to-digital converter or the analog-to-digital converter that does not perform the digital calibration, power consumption can be remarkably reduced by performing the present invention.

Also, compared to the case where the two separate ADCs of the high speed type and the low speed type are adopted, the present invention does not need the separate low-sample rate and high-resolution analog-to-digital converter for processing the low-data rate wireless receive signal, making it possible to remarkably reduce the circuit area. That is, as can be appreciated from one example of estimating the circuit area shown in FIG. 4, the area occupied by the chip of the analog-to-digital converter corresponding to the dual rate can drastically be reduced. In other words, the area corresponding to the low-sample rate and high-resolution analog-to-digital converter circuit is not required, making it possible to remarkably reduce the entire circuit area. In particular, in the SOC or the RF-IC, the present invention increases the degree of freedom in the layout of other circuit blocks by reducing the circuit area of the analog-to-digital converter, such that the overall characteristics of the receiver can be expected to be improved. Further, the present invention stops the operation of the high-sample rate main ADC when processing the low-data rate wireless receive signal, such that the effect of the high frequency clock signal, which is the operation clock of the ADC or the harmonic wave of the ADC on the RF circuit unit or the IF circuit unit due to the coupling between the power supply lines or the wirings can be reduced, thereby advantageously achieving, in view of the size, performance, and power consumption, a wireless communication system.

Further, only the reference analog-to-digital conversion unit is powered-on so as to perform the analog-to-digital conversion process in low data rates and the main analog-to-digital conversion unit or the digital calibration section is powered-down between low data rates, thereby remarkably reducing power consumption of the analog-to-digital converter.

Second Embodiment

Figure 5:
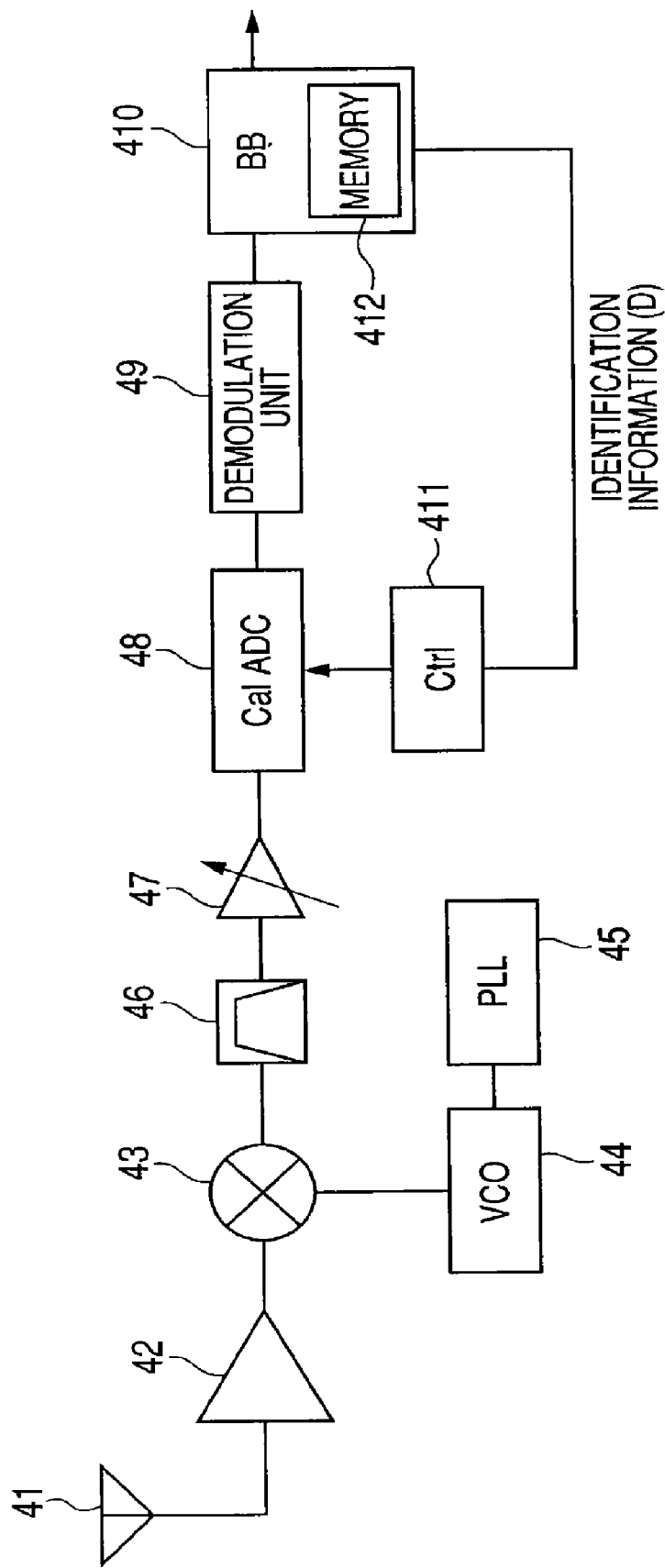
FIG. 5 is a view showing an entire circuit configuration of a receiver circuit in a wireless transceiver circuit according to a second embodiment of the present invention.

A receiver circuit in a wireless transceiver circuit including an analog-to-digital converter according to a second embodiment of the present invention will be described with reference to FIGS. 5 to 7. FIG. 5 shows an entire circuit configuration of the receiver circuit in the wireless transceiver circuit according to the second embodiment. The second embodiment discloses a case where the identification information (D) is provided from the baseband signal processing unit as in the first embodiment.

As shown in FIG. 5, a memory 412 in a baseband signal processing unit 410 holds information on kinds of received signals, data rate, a data length, or a data period, or the like, the identification information (D) is obtained based on the information, and the control signal Ctrl is generated on the basis of the identification information (D).

Signals input from an antenna 41 are amplified in a high frequency amplification unit 42, which are in turn multiplied by local oscillation signals generated from a voltage controlled oscillator 44 and a phase synchronization loop 45 by means of a frequency conversion circuit 43 to be frequency-converted into a low-intermediate frequency (or, zero frequency). Interference wave components of the intermediate frequency signal or the baseband signal are removed in a filter 46, which are in turn amplified in a variable gain amplifier 47 and input to a digital calibration type analog-to-digital converter 48. In a high data rate, the digital calibration type analog-to-digital converter 48 serves as the general digital calibration type analog-to-digital converter to perform the high-sample rate and high-resolution analog-to-digital conversion, by a control signal provided from a switching control section 411 based on the identification information (D). On the other hand, in a low data rate, a reference analog-to-digital conversion unit included in the digital calibration type analog-to-digital converter 48 performs the analog-to-digital conversion. At this time, the operations of the main analog-to-digital conversion unit, etc. are powered-down to stop, thereby reducing power consumption.

The identification information (D) is provided by the baseband signal processing unit 410. In other words, in a wireless system, such as a cellular, or the like, information on a receive timing or a data rate of signals received by each terminal is previously scheduled as schedule information. The schedule information is held and managed in the memory 412 in the baseband signal processing unit 410. For this reason, the baseband signal processing unit 410 can generate and supply the identification information (D) required for controlling the digital calibration type analog-to-digital converter based on the schedule information.

For example, when receiving first/second/3.5-generation low-data rate cellular signals, the baseband signal processing unit 410 generates the identification information (D) and the control signal Ctrl as in FIG. 3 so that the reference analog-to-digital conversion unit 482 included in the digital calibration type analog-to-digital converter 48 serves as the analog-to-digital converter. The digital calibration type analog-to-digital converter 48 powers-on only the reference analog-to-digital conversion unit 482 by the control signal Ctrl so as to reduce power consumption.

On the other hand, when receiving 3.9/4-generation high-data rate cellular signals, the baseband signal processing unit 410 generates the identification information (D) and the control signal Ctrl as in FIG. 3 so that the digital calibration type analog-to-digital converter 48 serves as the basis for the general digital calibration type analog-to-digital converter to operate both the main analog-to-digital conversion unit 483 and the digital calibration section 484.

Further, the relationship of the identification information (D) and the operation of each component of the digital calibration type analog-to-digital converter 48 is of course not limited to the above-mentioned description.

A gain of the variable gain amplifier 47 is automatically set so that amplitude in output voltage of the variable gain amplifier is equal to or less than an input dynamic range of the digital calibration type analog-to-digital converter 48. The signals digitized by the digital calibration type analog-to-digital converter 48 are demodulated in a demodulation unit 49, which are in turn subjected to an upper layer process by a baseband signal processing unit 410. The filter 46 is implemented by a band pass filter based on an intermediate frequency when the intermediate frequency is not zero and is implemented by a low pass filter when the intermediate frequency is zero (a case of direct conversion).

Figure 6:
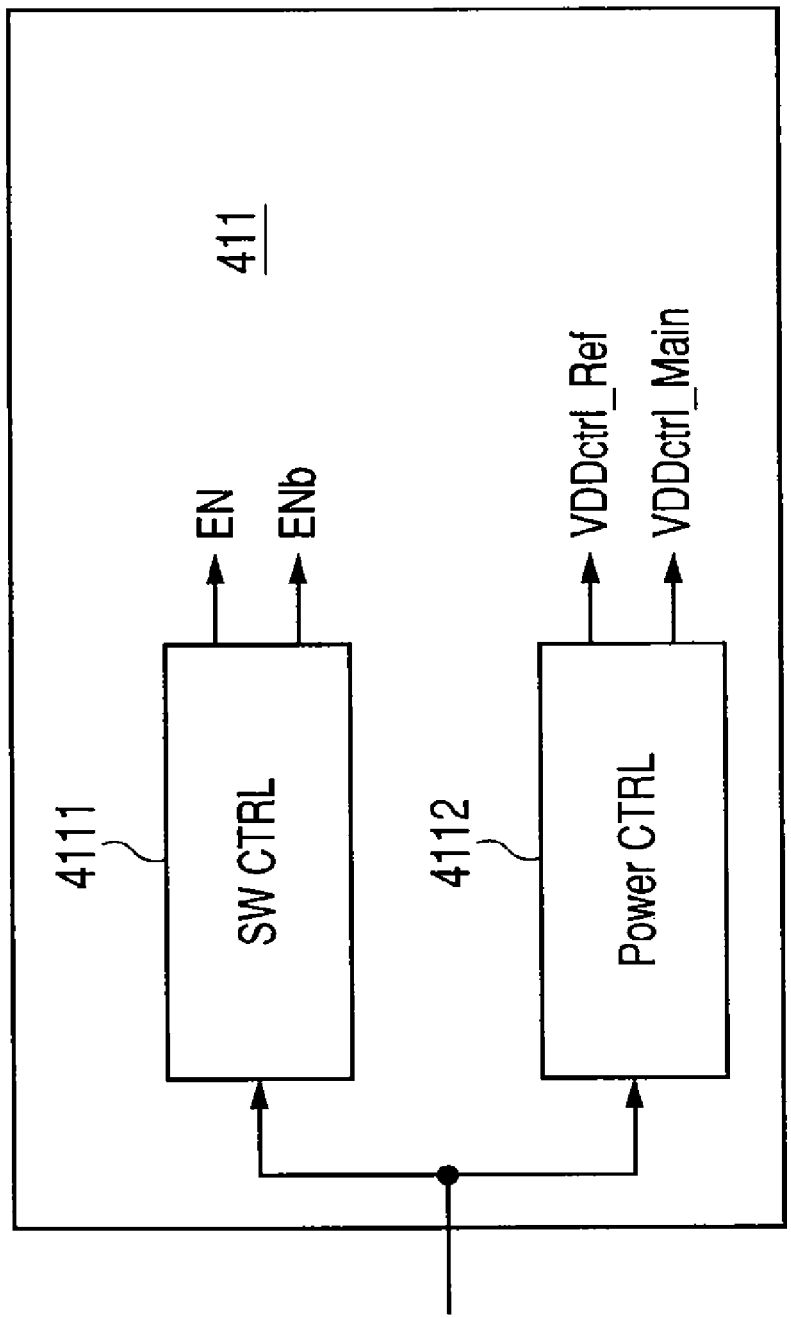
FIG. 6 is a view showing a concrete configuration of a switching control section in a second embodiment of the present invention.

FIG. 6 shows a concrete configuration example of the switching control section 411 in the second embodiment. FIG. 7 shows a concrete configuration example of the digital calibration type analog-to-digital converter 48 according to the second embodiment. Also, the digital calibration technology is described in the Y. Chiu et al. and the Takashi Ohshima described above and therefore, the detailed description thereof will not be repeated by citing the contents described in the Y. Chiu et al. and Takashi Ohshima.

In FIG. 6, the switching control section 411 includes a switch control section 4111 and a power supply control section 4112. The switch control section 4111 generates an EN signal and an ENb (a logically inverted signal of the EN signal), and controls a connection state of the digital calibration type analog-to-digital converter, according to the input identification information (D). For example, when the identification information (D) indicates a low-data rate, the switch control section 4111 outputs the EN signal as a high level H and the ENb signal as a low level L, such that only the reference analog-to-digital conversion unit included in the digital calibration type analog-to-digital converter performs the analog-to-digital conversion. On the other hand, when the identification information (D) indicates a high-data rate, the switch control section 4111 outputs the EN signal as a low level L and the ENb signal as a high level H, such that the digital calibration type analog-to-digital converter is operated as the general digital calibration type analog-to-digital converter.

The identification information (D) is also applied to the power supply control section 4112, which generates a gate signal VDDctrl_Main or VDDctrl_Ref for controlling an on/off of each power supply voltage from a sample and hold circuit 481, the reference analog-to-digital conversion unit 482, the main analog-to-digital conversion unit 483, and the digital calibration section 484 at a predetermined timing. Of course, it may be allowed to add an output for individually controlling the power supply voltage from the sample and hold circuit or the digital calibration section to the output from the power supply control section 4112.

Figure 7:
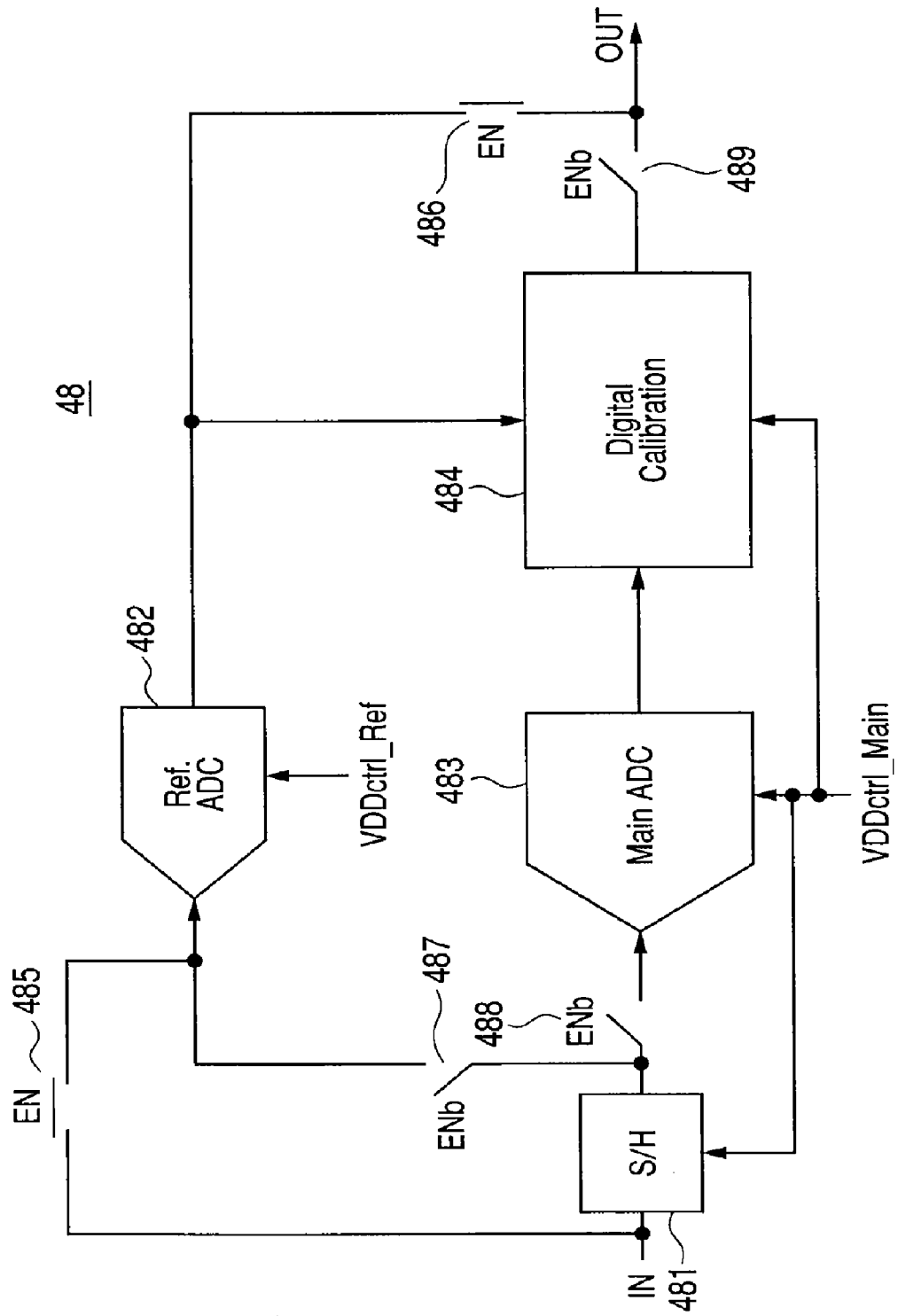
FIG. 7 is a view showing a concrete configuration example of a digital calibration type analog-to-digital converter according to the second embodiment of the present invention.

In the digital calibration type analog-to-digital converter 48 of FIG. 7, an input analog voltage is sampled and held at a high sample rate as in the main analog-to-digital conversion unit 483 by means of the sample and hold circuit 481. The outputs from the sample and hold circuit 481 are applied to the main analog-to-digital conversion unit 483 and the reference analog-to-digital conversion unit 482, respectively, via an SW 488 and an SW 487. The main analog-to-digital conversion unit 483 is operated at a sufficiently high sample rate, which can process high-data rate wireless signals. On the other hand, the reference analog-to-digital conversion unit 482 is operated at an extent capable of processing low-data rate wireless signals, that is, a sufficiently delayed sample rate, as compared to the main analog-to-digital conversion unit 483.

The outputs from the main analog-to-digital conversion unit 483 and the outputs from the reference analog-to-digital conversion unit 482 are applied to the digital calibration section 484 and the calibrated results are then output via an SW 489. Further, the input analog voltage is applied to an input part of the reference analog digital conversion unit 482 via an SW 485. Also, the outputs from the reference analog-to-digital conversion unit 482 are output via an SW 486. When receiving high-data rate signals, the ENb is at a high level H, such that the SW 487, SW 488, and SW 489 turn on. Also, the En is at a low level L, such that the SW 485 and the SW 489 turn off. As a result, the digital calibration type analog-to-digital converter is operated as the general digital calibration type analog-to-digital converter.

On the other hand, when receiving low-data rate signals, the EN is at a high level H such that the SW 485 and SW 486 turn on and the ENb is at a low level L such that the SW 487, SW 488, and SW 489 turn off. As a result, the input/output nodes of the reference analog-to-digital conversion unit 482 is connected to the input IN and the output OUT. The power supply voltages of the main analog-to-digital conversion unit 483, the sample and hold circuit 481, and the digital calibration section 484 are on/off-controlled by the VDDctrl_Main. Further, the power supply voltage of the reference analog-to-digital conversion unit 482 is controlled by the VDDctrl_Ref.

With the second embodiment, in the wireless circuit receiving the multi-rate data, power consumption and circuit area of the analog-to-digital converter can be reduced.

Third Embodiment

Figure 8:
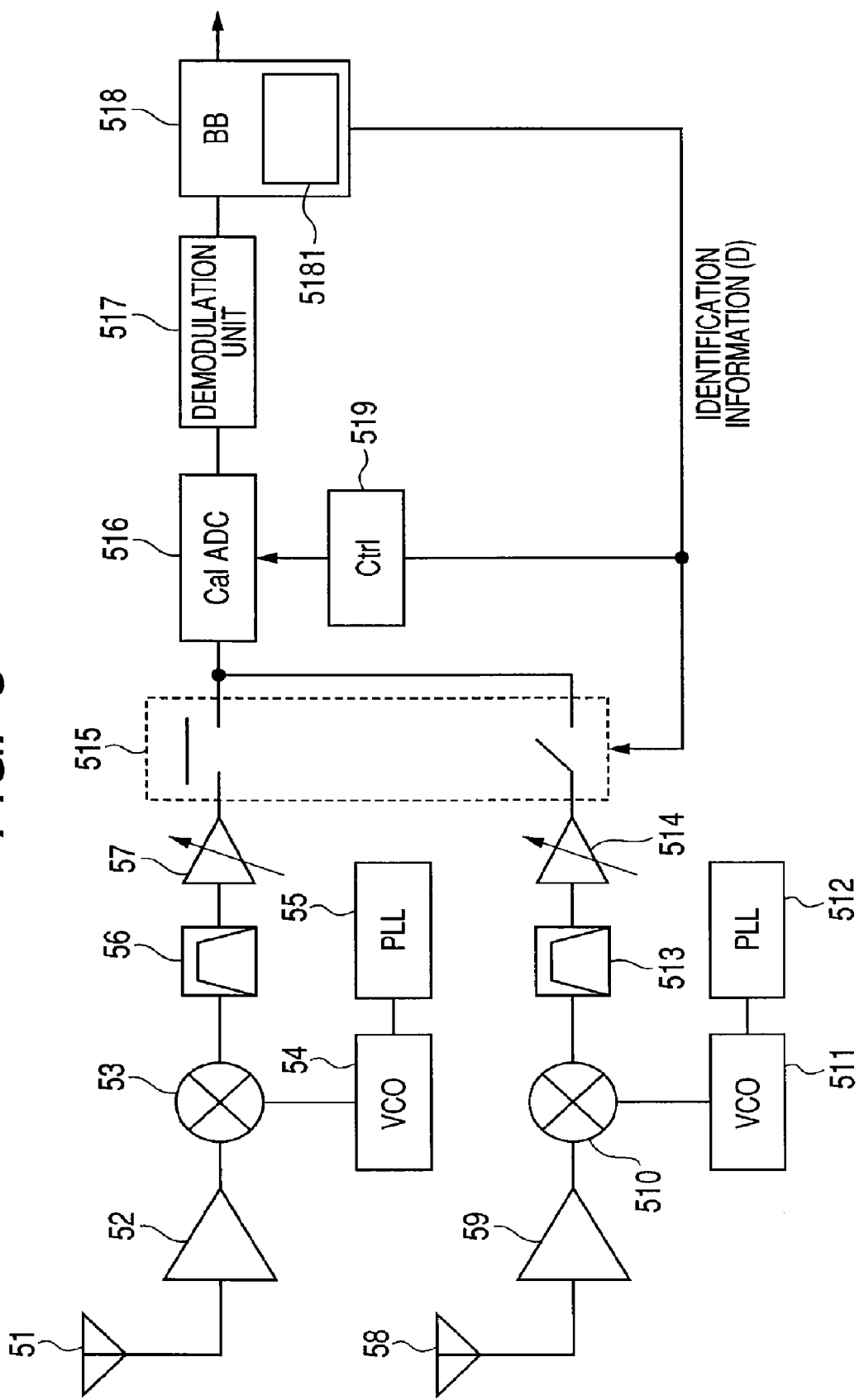
FIG. 8 is a view showing a configuration example of a digital calibration type analog-to-digital converter according to a third embodiment of the present invention.
Figure 9:
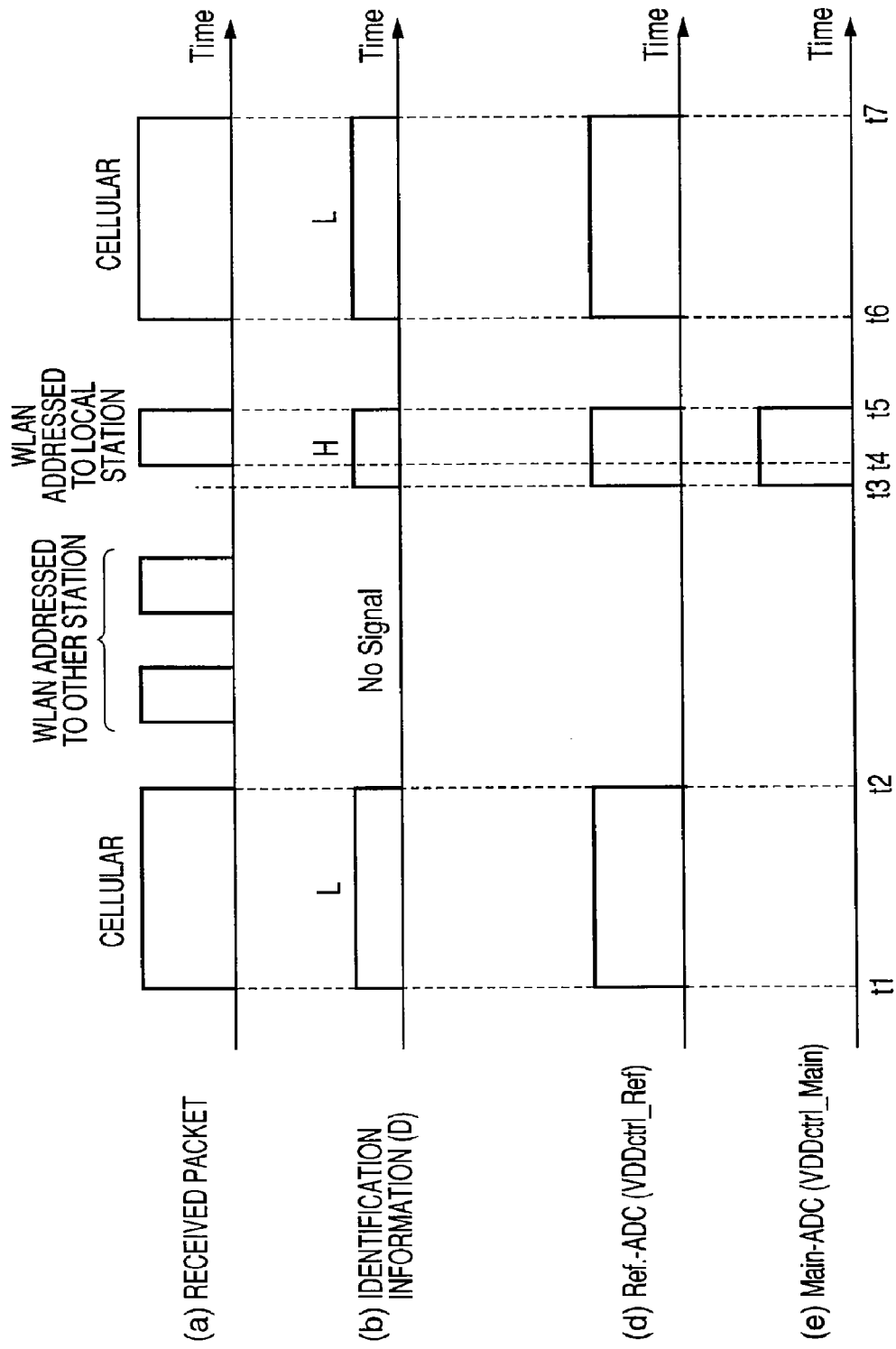
FIG. 9 is a timing chart according to a third embodiment of the present invention.

A receiver circuit in a wireless transceiver circuit including an analog-to-digital converter according to a third embodiment of the present invention will be described with reference to FIGS. 8 and 9. FIG. 8 shows a configuration example of the digital calibration type analog-to-digital converter according to the third embodiment of the present invention. FIG. 9 shows a timing chart of the digital calibration type analog-to-digital converter. The third embodiment changes a portion of the second embodiment, such that the digital calibration type analog-to-digital converter is configured to meet a case where there are individual analog front end units corresponding to plural wireless systems for reception.

In FIG. 8, signals belonging to a wireless system 1 (for example, a cellular system) are received in an antenna 51, which are in turn amplified in a high frequency amplifier 52 and multiplied by local oscillation signals generated from a voltage controlled oscillator 54 and a phase synchronization loop 55 by means of a frequency conversion circuit 53 to be frequency-converted into a low-intermediate frequency (or, zero frequency). Interference wave components of the intermediate frequency signal or the baseband signal are removed in a filter 56, which are in turn amplified in a variable gain amplifier 57 and input to a digital calibration type analog-to-digital converter 516 via a switch SW 515.

On the other hand, signals belonging to a wireless system 2 (for example, a wireless LAN system) are received in an antenna 58, which are in turn amplified in a high frequency amplifier 59 and multiplied by local oscillation signals generated from a voltage controlled oscillator 511 and a phase synchronization loop 512 by means of a frequency conversion circuit 510 to be frequency-converted into a low-intermediate frequency (or, zero frequency). Interference wave components of the intermediate frequency signal or the baseband signal are removed in a filter 513, which are in turn amplified in a variable gain amplifier 514 and input to the digital calibration type analog-to-digital converter 516 via the switch SW 515. Further, it may be allowed to commonly use a portion of a circuit unit from the antenna to the variable gain amplification unit.

In a high data rate, the digital calibration type analog-to-digital converter 516 serves as the general digital calibration type analog-to-digital converter by means of a control signal provided from a switching control section 519 on the basis of the identification information (D) that holds information, such as kinds of currently received signals, data rate, or the like, such that it performs the high-sample rate and high-resolution analog-to-digital conversion. On the other hand, in a low data rate the digital calibration type analog-to-digital converter 516 is switched such that the reference analog-to-digital conversion unit included in the digital calibration type analog-to-digital converter 516 performs the analog-to-digital conversion process. When the analog-to-digital conversion process is performed by only the reference analog-to-digital conversion unit, the operations of the main analog-to-digital conversion unit, etc. are powered-down to stop, thereby reducing power consumption.

The identification information (D) is also applied to the SW 515, which applies any one of an output from the variable gain amplifier 57 outputting the signals of the wireless system 1 and an output from the variable gain amplifier 514 outputting the signals of the wireless system 2 to an input part of the digital calibration type analog-to-digital converter 516. The identification information (D) is provided from a memory 5181 in a baseband signal processing unit 518.

In the wireless system, such as a cellular, a wireless LAN, or the like, a receive timing or a data rate of signals received by each terminal is previously scheduled as schedule information. Since the schedule information is managed by the baseband signal processing unit 518, the identification information (D) can be supplied to a switching control section 519 or a switch SW 515 regardless of whether or not the signals are received.

Generally, since the data rate of the cellular system is delayed as compared to the data rate of the wireless LAN system, when receiving the cellular signals, the switching control section 519 controls, for example, the reference analog-to-digital conversion unit included in the digital calibration type analog-to-digital converter 516 to perform the analog-to-digital conversion process and controls the main analog-to-digital conversion unit to be powered-down, etc., by the identification information (D) issued from the baseband signal processing unit 518, thereby reducing power consumption.

On the other hand, when receiving the high-data rate wireless LAN signals, the switching control section 519 controls, for example, the digital calibration type analog-to-digital converter 516 to operate as the general digital calibration type analog-to-digital converter by the identification information (D) issued from the baseband signal processing unit 518.

The gain of the variable gain amplifier 57 or 514 is automatically set so that amplitude in output voltage of the variable gain amplifier is equal to or less than an input dynamic range of the digital calibration type analog-to-digital converter 516. The signals digitized by the digital calibration type analog-to-digital converter 516 are demodulated in a demodulation unit 517, which are in turn subjected to an upper layer process by a baseband signal processing'unit 518. The filter 56 or 513 is implemented by a band pass filter based on an intermediate frequency when the intermediate frequency is not zero and is implemented by a low pass filter when the intermediate frequency is zero (a case of direct conversion).

The third embodiment is in particular suited to apply to the wireless terminal that receives the signals of the plural different wireless systems, but is of course not limited thereto.

In the timing chart of the third embodiment shown in FIG. 9, when receiving the cellular signals, the reference analog-to-digital conversion unit included in the digital calibration analog-to-digital converter 516 performs the analog-to-digital conversion process by the identification information (D) issued from the baseband signal processing unit 518, while the main analog-to-digital conversion unit, etc. is powered-down so as to reduce power consumption. When receiving the wireless LAN signals, the digital calibration type analog-to-digital converter 516 is operated as the general digital calibration type analog-to-digital converter. For this reason, in order to operate both the built-in main analog-to-digital conversion unit and the reference analog-to-digital conversion unit, they both are in a power-on state.

As described above, the identification information (D) is generated by the scheduling function, such that the digital calibration type analog-to-digital converter 516 can be powered-down except for the time when the cellular signals or wireless LAN signals addressed to a local station are received, making it possible to reduce average power consumption. Further, a reduction of a circuit area can be increased.

Fourth Embodiment

Figure 10:
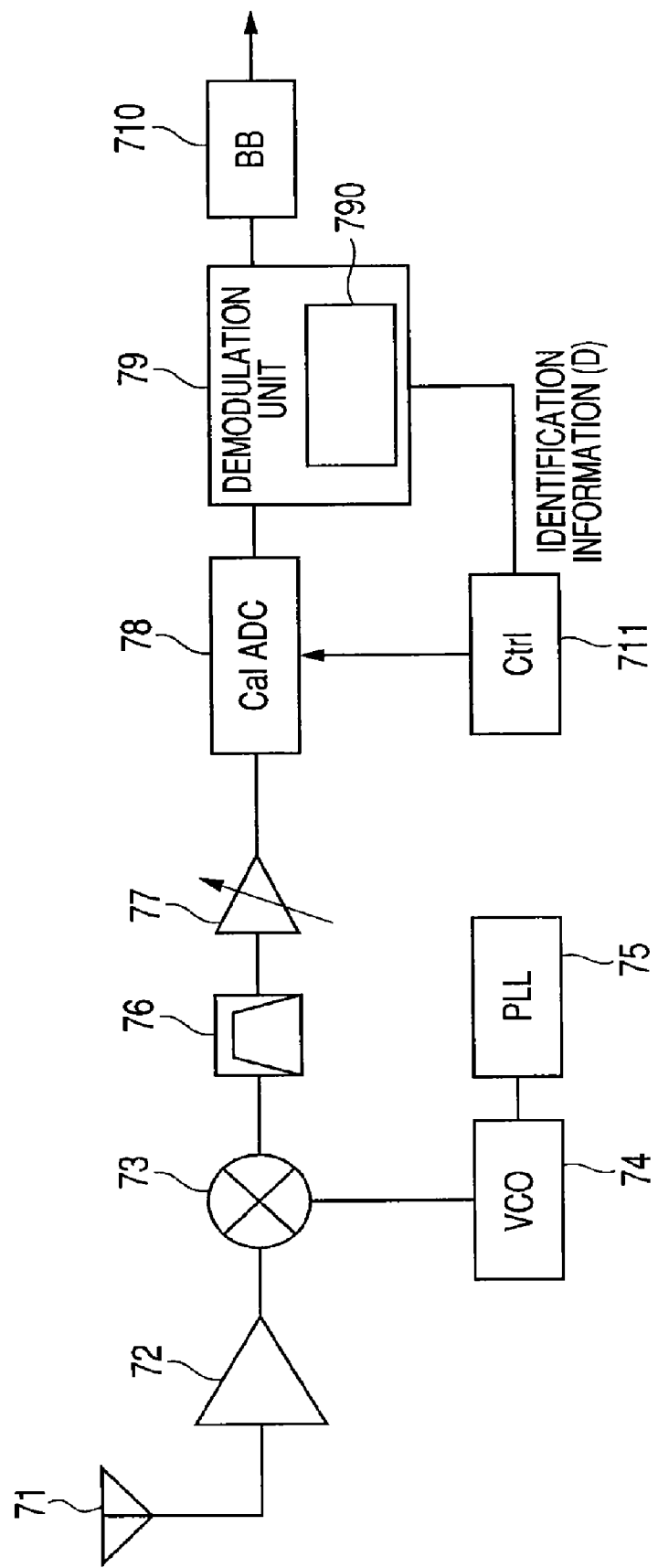
FIG. 10 is a view showing an entire circuit configuration of a receiver circuit in a wireless transceiver circuit according to a fourth embodiment of the present invention.
Figure 11:
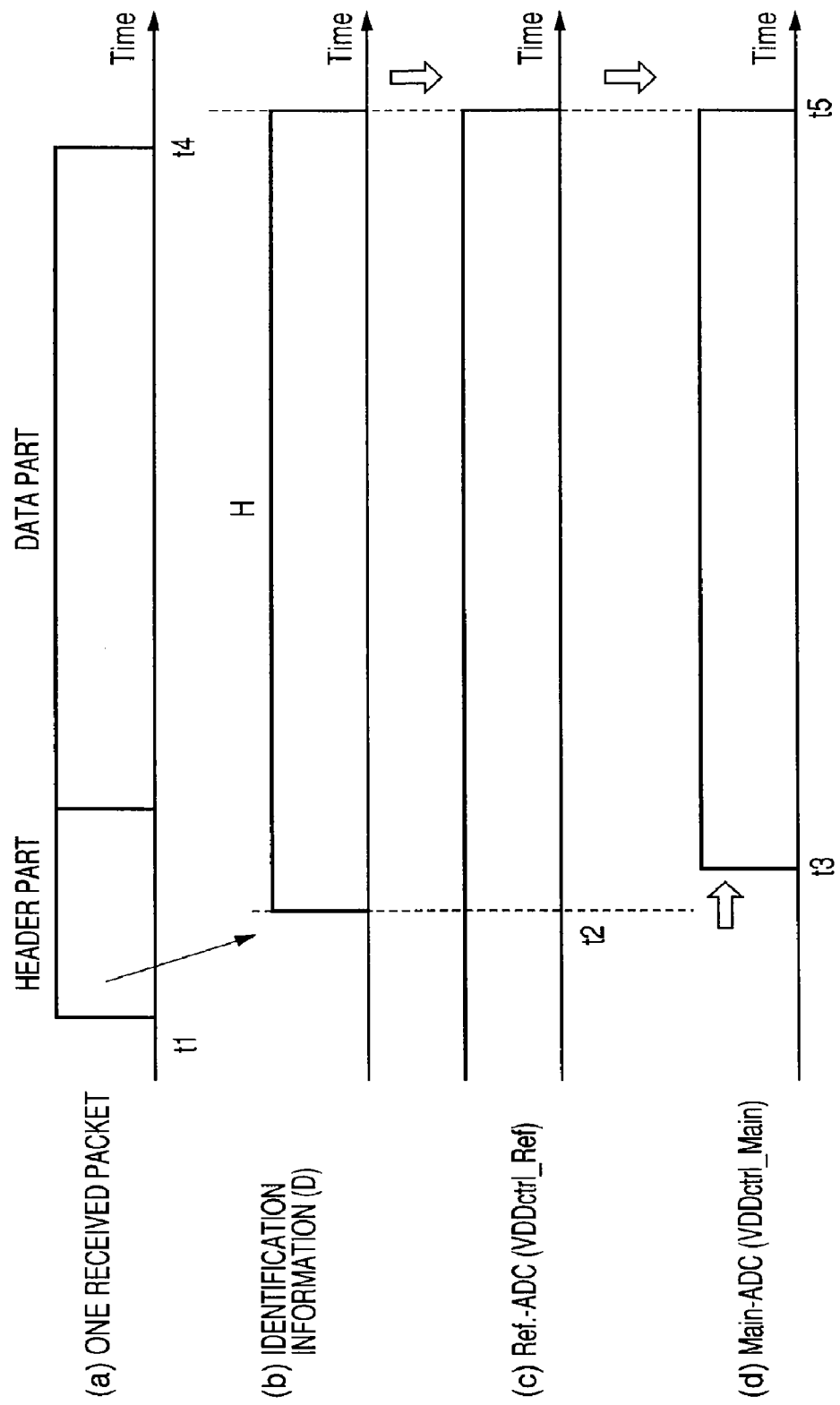
FIG. 11 is a timing chart according to a fourth embodiment of the present invention.
Figure 12:
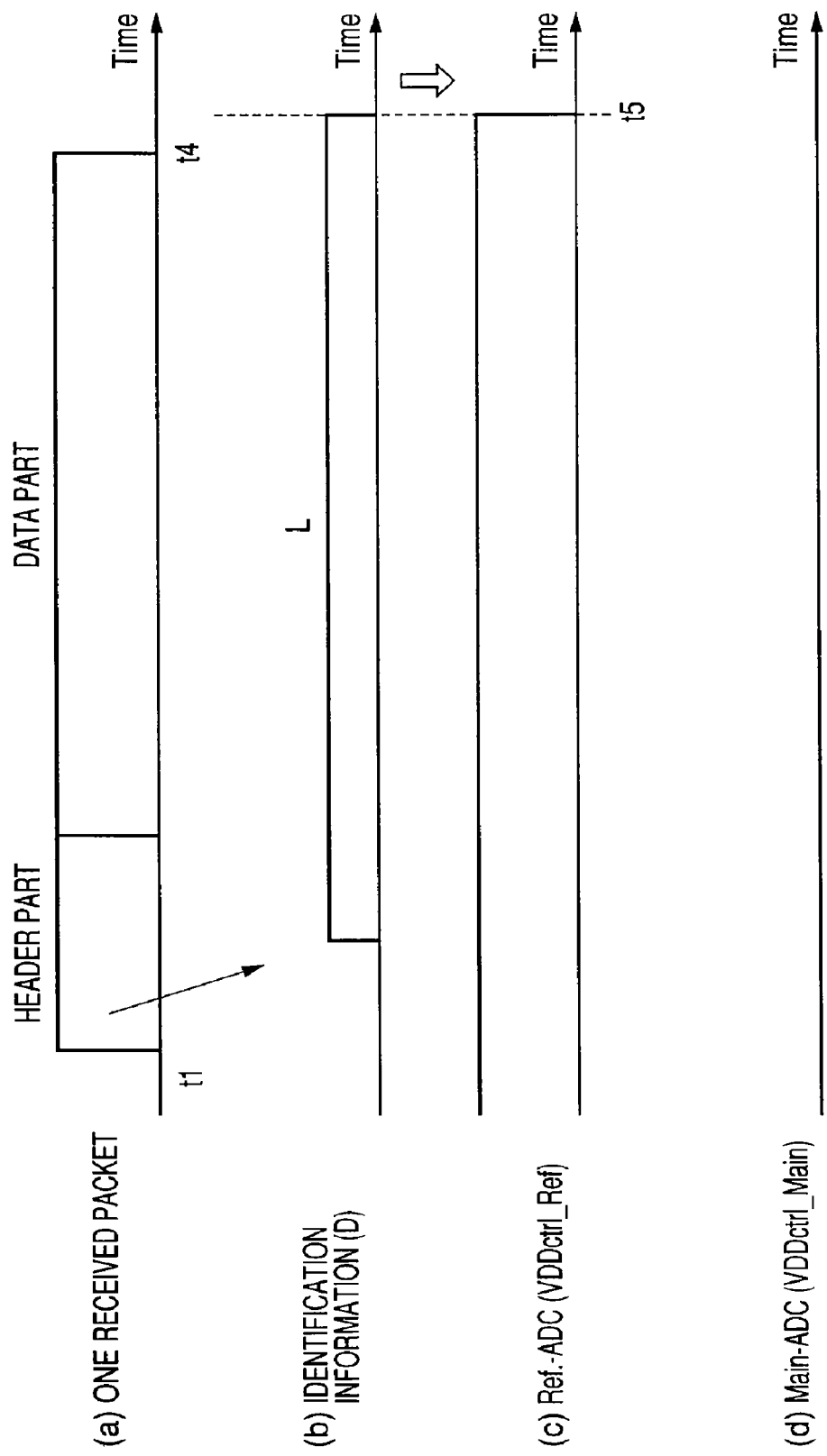
FIG. 12 is a timing chart according to a fourth embodiment of the present invention.

A receiver circuit in a wireless transceiver circuit including an analog-to-digital converter according to a fourth embodiment of the present invention will be described with reference to FIGS. 10 to 12. FIG. 10 shows a configuration example of a digital calibration type analog-to-digital converter according to a fourth embodiment. FIGS. 11 and 12 show timing charts of the digital calibration type analog-to-digital converter. The fourth embodiment discloses a case where the identification information (D) is provided from the demodulation unit as in the first embodiment. In other words, as shown in FIG. 10, a demodulation unit 79 includes an identification information generation function 790 that generates the identification information (D) based on demodulation signals.

Signals input from an antenna 71 are amplified in a high frequency amplification unit 72, which are in turn multiplied by local oscillation signals generated from a voltage controlled oscillator 74 and a phase synchronization loop 75 by means of a frequency conversion circuit 73 to be frequency-converted into a low-intermediate frequency (or, zero frequency). Interference wave components of the intermediate frequency signal or the baseband signal are removed in a filter 76, which are in turn amplified in a variable gain amplifier 77 and input to a digital calibration type analog-to-digital converter 78. In a high data rate, the digital calibration type analog-to-digital converter 78 serves as the general digital calibration type analog-to-digital converter to perform the high-sample rate and high-resolution analog-to-digital conversion and in a low data rate, the reference analog-to-digital conversion unit included in the digital calibration type analog-to-digital converter 78 performs an analog-to-digital conversion process, by a control signal provided from a switching control section 711 on the basis of the identification information (D) that holds information, such as the kinds of currently received signals, data rate, or the like. At this time, the operations of the main analog-to-digital conversion unit, etc. is powered-down to stop, thereby reducing power consumption.

The identification information (D) is provided by the identification information generation function 790 in the demodulation unit 79. The gain of the variable gain amplifier 77 is automatically set so that amplitude in output voltage of the variable gain amplifier is equal to or less than an input dynamic range of the digital calibration type analog-to-digital converter 78.

The signals digitized by the digital calibration type analog-to-digital converter 78 are demodulated in the demodulation unit 79, which are in turn subjected to an upper layer process by a baseband signal processing unit 710. The filter 76 is implemented by a band pass filter based on an intermediate frequency when the intermediate frequency is not zero and is implemented by a low pass filter when the intermediate frequency is zero (a case of direct conversion).

Generally, in the multi-rate wireless system, such as the wireless LAN, etc., as shown in FIGS. 11 and 12, data rate information of a data part in a signal packet exists in a header part positioned at a head of the packet. Further, the header part is generally modulated depending on a fixed rate having the lowest band, that is, the smallest band, not depending on the data rate of the data part. As shown in FIG. 11, only the reference analog-to-digital conversion unit included in the digital calibration type analog-to-digital converter 78 is powered-on, such that the analog-to-digital conversion is performed during the header period of the packet by using the analog-to-digital converter.

The identification information generation function 790 in the demodulation unit 79 demodulates the analog-to-digital conversion results and obtains information on the data rate and data length of the data part, which are written in the header part. The demodulation unit 79 generates the identification information (D) based on the obtained data rate and data length. When it is determined that the data rate of the data part is a high data rate corresponding to, for example, IEEE 802.11n or post 11n, which is the standard for the wireless LAN, the digital calibration type analog-to-digital converter 78 is operated as the general digital calibration type analog-to-digital converter by the identification information (D). Further, in order to perform the high-sample rate and high-resolution analog-to-digital conversion on the signals of the data part, as shown in FIG. 11, the digital calibration type analog-to-digital converter 78 is controlled by the identification information (D) so that the reference analog-to-digital conversion unit as well as the main analog-to-digital conversion unit is operated in a power-on state. An on period of the identification information (D) is determined based on the obtained data length. Further, since there are no the demodulation data when the wireless system starts, the reference analog-to-digital conversion unit continues to operate such that receive timing information of the later received packet is obtained from the demodulation data. Thereafter, the reference analog-to-digital conversion unit is controlled by the identification information (D) based on the obtained receive timing information.

On the other hand, when it is determined that the data rate of the data part is a low data rate corresponding to, for example, IEEE 802.11a/b/g, which is a standard of the wireless LAN, since the analog-to-digital conversion by only the reference analog-to-digital conversion unit included in the digital calibration type analog-to-digital converter 78 may be allowed to be continued during the data period of the packet, as shown in FIG. 12, the main analog-to-digital conversion unit is controlled by the identification information (D) so that it is maintained at a powered-down state.

The fourth embodiment is in particular suited to apply to the multi-mode wireless terminal, which receives the plural different data rate signals, in the system, such as the wireless LAN, or the like where the information of the data rate is loaded in the header part of the signal, but is of course not limited thereto.

With the fourth embodiment, in the wireless circuit receiving the multi-rate data, power consumption of the analog-to-digital converter can be reduced as well as the reduction of the circuit area of the analog-to-digital converter can be promoted.

Fifth Embodiment

Figure 13:
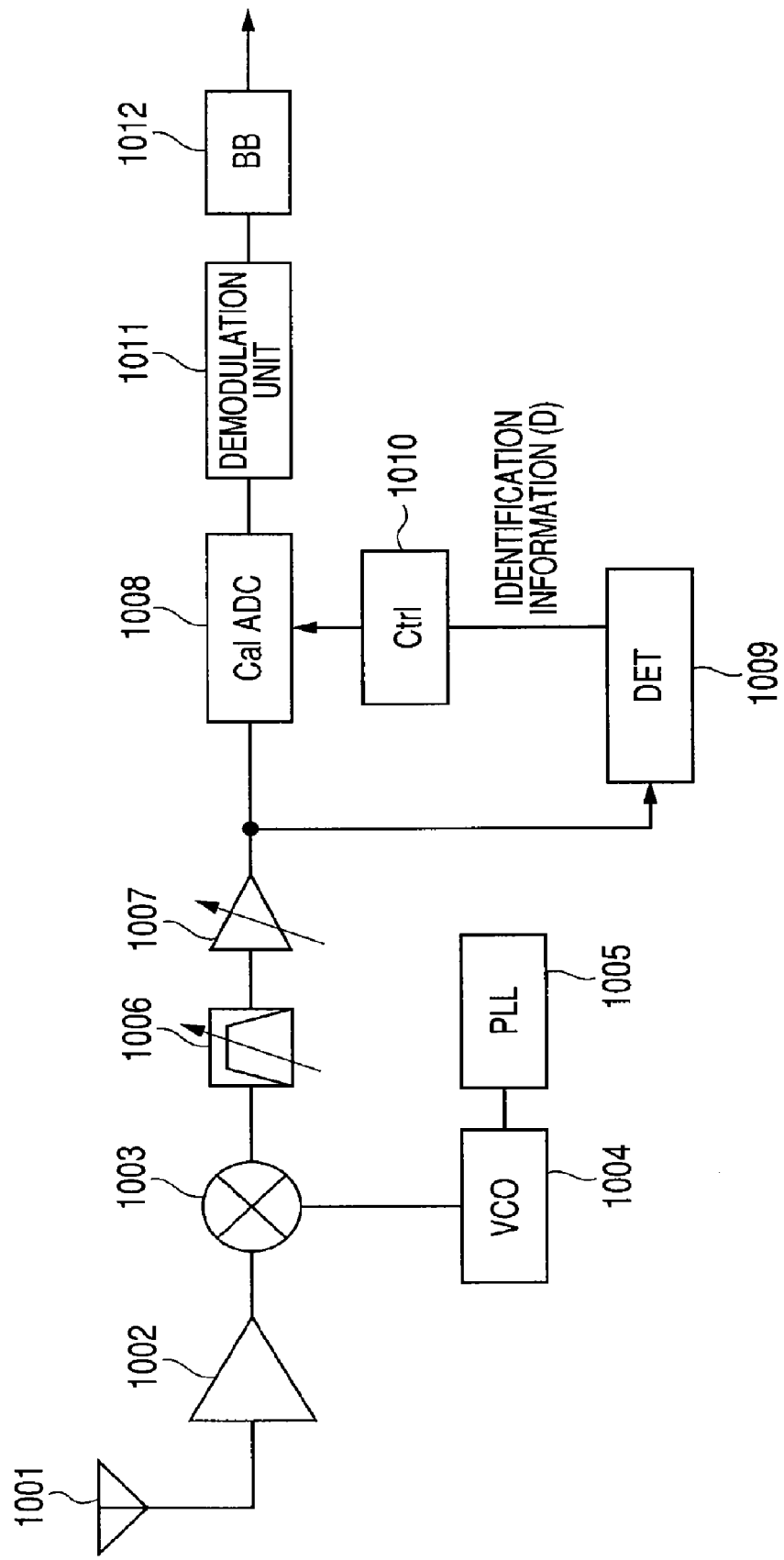
FIG. 13 is a view showing an entire circuit configuration of a receiver circuit in a wireless transceiver circuit according to a fifth embodiment of the present invention.
Figure 14:
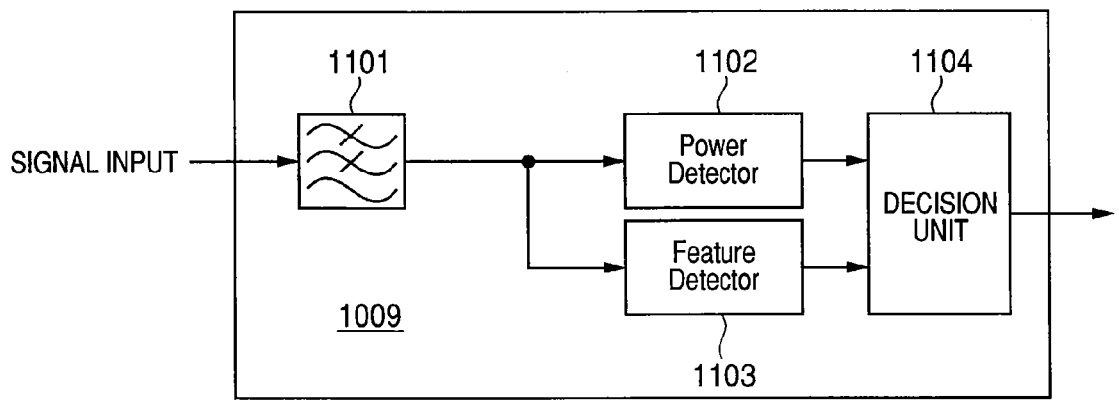
FIG. 14 is a view showing a configuration example of a signal detection unit according to a fifth embodiment.

A receiver circuit in a wireless transceiver circuit including an analog-to-digital converter according to a fifth embodiment of the present invention will be described with reference to FIGS. 13 and 14. FIG. 13 shows a configuration example of the digital calibration type analog-to-digital converter according to the fifth embodiment of the present invention. FIG. 14 shows a configuration example of a signal detection unit according to the fifth embodiment. The fifth embodiment discloses a case where the identification information (D) in the first embodiment is provided by the detection results of the separate installed signal detection unit.

In FIG. 13, signals input from an antenna 1001 are amplified in a high frequency amplification unit 1002, which are in turn multiplied by local oscillation signals generated from a voltage controlled oscillator 1004 and a phase synchronization loop 1005 by means of a frequency conversion circuit 1003 to be frequency-converted into a low-intermediate frequency (or, zero frequency). Interference wave components of the intermediate frequency signal or the baseband signal are removed in a filter 1006, which are in turn amplified in a variable gain amplifier 1007 and input to a digital calibration type analog-to-digital converter 1008. In a high data rate, the digital calibration type analog-to-digital converter 1008 serves as the general digital calibration type analog-to-digital converter to perform the high-sample rate and high-resolution analog-to-digital conversion and in a low data rate, the reference analog-to-digital conversion unit included in the digital calibration type analog-to-digital converter 1008 performs an analog-to-digital conversion process, by a control signal provided from a switching control section 1010 on the basis of the identification information (D) that holds information, such as the kinds of currently received signals, data rate, or the like. In a low data rate, the operations of the main analog-to-digital conversion unit, etc. is powered-down to stop, thereby reducing power consumption.

The identification information (D) is provided by, for example, the signal detection unit 1009 connected to an output part of the variable gain amplifier 1007. A connection position of the signal detection unit 1009 is of course not limited thereto. A gain of the variable gain amplifier 1007 is automatically set so that amplitude in output voltage of the variable gain amplifier is equal to or less than an input dynamic range of the digital calibration type analog-to-digital converter 1008. The signals digitized by the digital calibration type analog-to-digital converter 1008 are demodulated in a demodulation unit 1011, which are in turn subjected to an upper layer process by a baseband signal processing unit 1012. The filter 1006 is implemented by a band pass filter based on an intermediate frequency when the intermediate frequency is not zero and is implemented by a low pass filter when the intermediate frequency is zero (a case of direct conversion).

FIG. 14 shows a configuration example of the signal detection unit 1009. After a band of an input signal is limited by a low pass filter 1101, for example, a signal amplitude voltage is obtained by a power detector 1102. The power detector 1102 can be implemented by a general rectifying circuit or a peak holding circuit. If necessary, outputs from the low pass filter 1101 are applied to a feature detector 1103 as shown in FIG. 9, such that the output may be an output corresponding to the feature of the received signal. The outputs from the power detector 1102 and the outputs from the feature detector 1103 are applied to a decision unit 1104, which decides the kinds of signals or data rate based on the inputs and outputs the identification information (D).

For example, if a cut-off frequency of the low pass filter 1101 is set to be sufficiently small, the output from the power detector 1102 becomes smaller at the time of receiving a high data rate, that is, a wideband signal at the time of receiving a low data rate, which is a narrowband signal. Therefore, the decision unit 1104 can identify the data rate of the signal according to the output value.

When receiving the high data rate signal, both the VDDctrl_Main and VDDctrl_Ref becomes H (power on) and when receiving the low data rate signal, the VDDctrl_Main becomes L (power off) and the VDDctrl_Ref becomes H (power on).

Further, when it is difficult to sufficiently identify the signal only using the power detection, it may be allowed to improve precision of decision in the decision unit 1104 by detecting, for example, maximum to minimum signal amplitude ratio or peak to average power ratio (PAPR) by the feature detector 1103. Of course, the fifth embodiment is not limited thereto.

With the fifth embodiment, in the wireless circuit receiving the multi-rate data, power consumption of the analog-to-digital converter can be reduced as well as the reduction of the circuit area of the analog-to-digital converter can be promoted.

Sixth Embodiment

Figure 15:
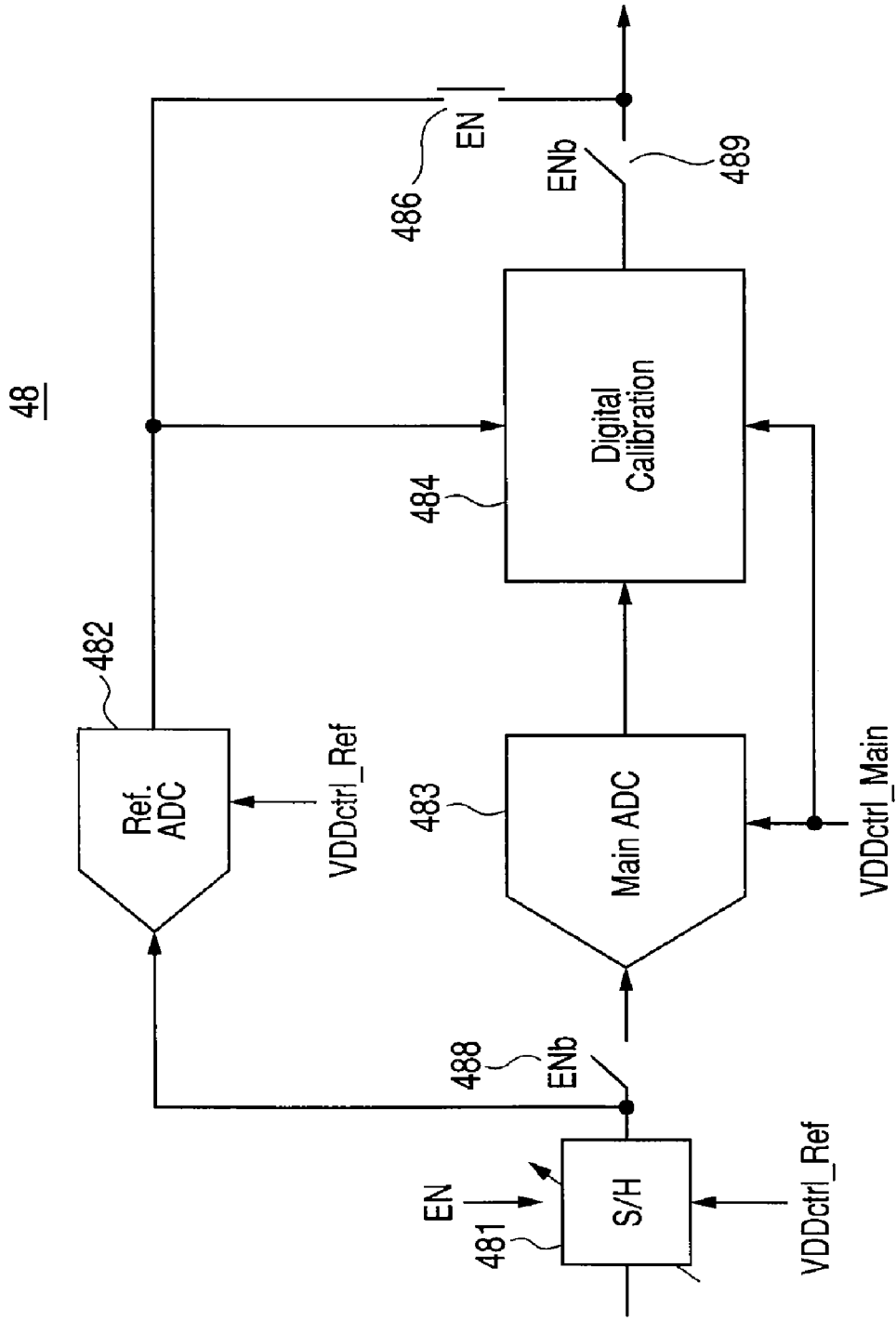
FIG. 15 is a view showing a configuration example of a digital calibration type analog-to-digital converter according to a sixth embodiment of the present invention.

An analog-to-digital converter according to a sixth embodiment of the present invention will be described with reference to FIG. 15. FIG. 15 shows an embodiment where a portion of the digital calibration type analog-to-digital converter shown in FIG. 7 is changed. In other words, the sixth embodiment is changed so that in a low data rate, the reference analog-to-digital conversion unit is not directly connected to the input, but is connected to the input through the sample and hold circuit 481. That is, the outputs from the sample and hold circuit 481 are applied to the main analog-to-digital conversion unit 483 via the SW 488 or are directly applied to the reference analog-to-digital conversion unit 482. The output from the main analog-to-digital conversion unit 483 and the output from the reference analog-to-digital conversion unit 482 are applied to the digital calibration section 484 and the calibrated results are then output via the SW 486 and the SW 489, respectively.

Since both the reference analog-to-digital conversion unit 482 and the sample and hold circuit 481 are operated at n a low data rate, the power supply voltage of the sample and hold circuit 481 is also controlled by, for example, the VDDctrl_Ref. Further, by the EN signal, in a high data rate, the sample and hold circuit 481 is operated at a high sample rate as in the main analog-to-digital conversion unit 483, while in a low data rate it is operated at a low sample rate as in the reference analog-to-digital conversion unit 482.

With the sixth embodiment, in the wireless circuit receiving the multi-rate data, power consumption of the analog-to-digital converter can be reduced as well as the reduction of the circuit area of the analog-to-digital converter can be promoted.

Seventh Embodiment

A combination of each component, which configures the analog-to-digital converter 48 according to another embodiment of the present invention, is not limited to the respective embodiments. A configuration example of the analog-to-digital converter 48 according to another embodiment of the present invention will be described with reference to FIGS. 16 to 20.

Figure 16:
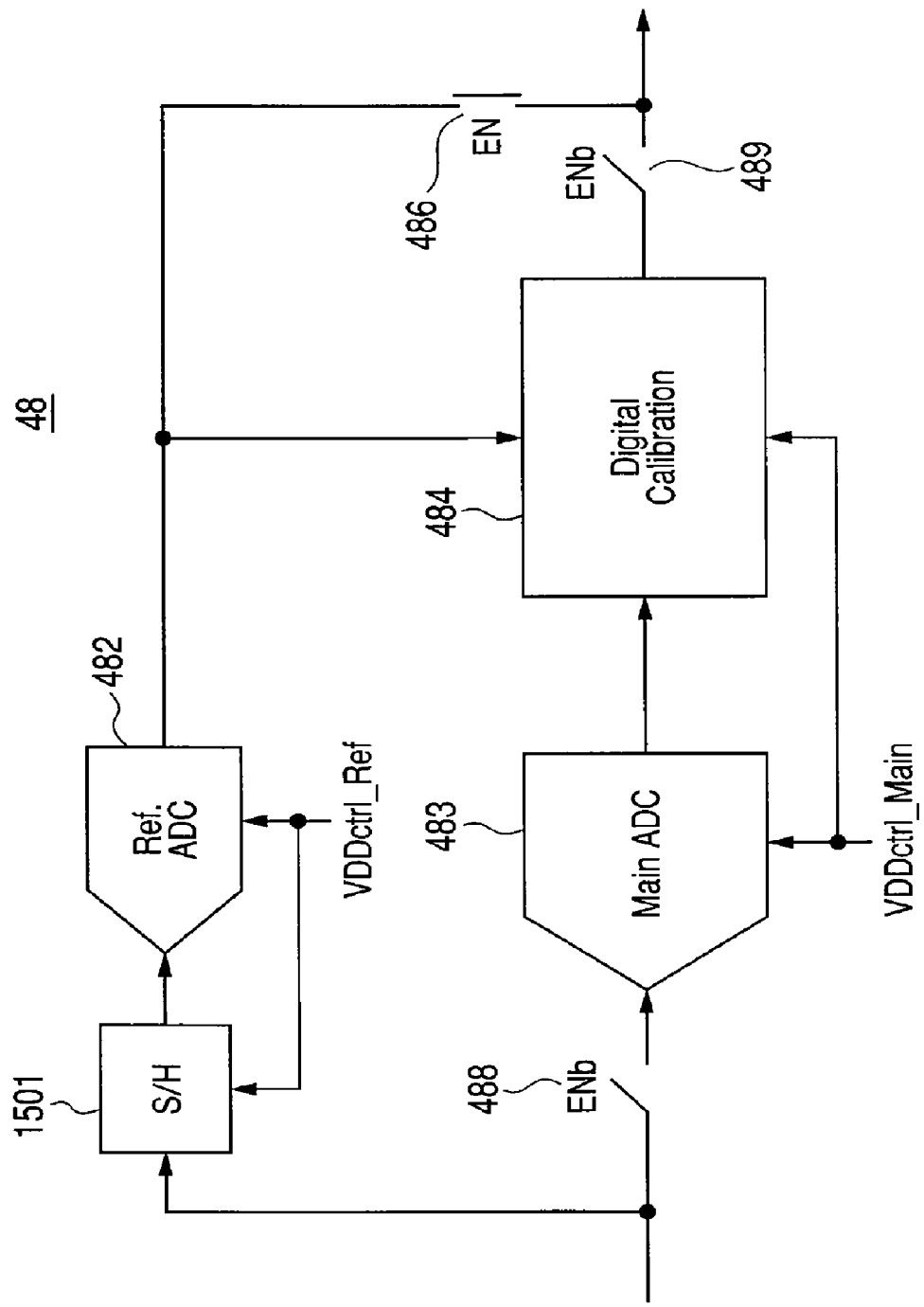
FIG. 16 is a view showing a configuration example of a digital calibration type analog-to-digital converter according to another embodiment of the present invention.

FIG. 16 shows an example of the analog-to-digital converter 48 where the sample and hold circuit 1501 is arranged as a dedicated circuit for the reference analog-to-digital conversion unit 482. The input signal is input to the sample and hold circuit 1501 and at the same time, is input to the main analog-to-digital conversion unit 483 via the SW488. The outputs from the main analog-to-digital conversion unit 483 and the outputs from the reference analog-to-digital conversion unit 482 are applied to the digital calibration section 484 and the calibrated results are then output via the SW 486 and the SW 489, respectively.

Figure 17:
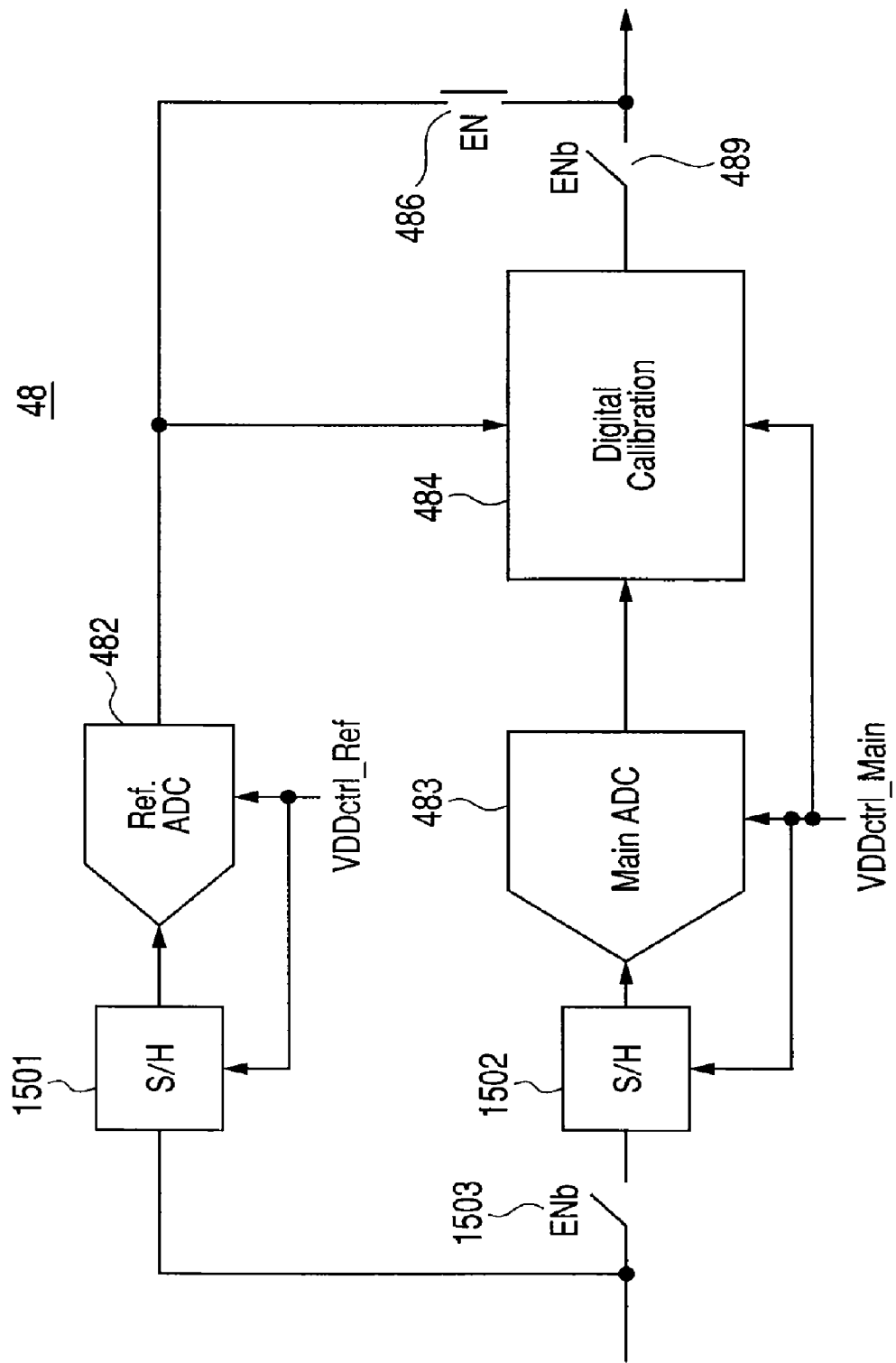
FIG. 17 is a view showing a configuration example of a digital calibration type analog-to-digital converter according to another embodiment of the present invention.

FIG. 17 shows an example of the analog-to-digital converter 48 where each of the sample and hold circuits 1503 and 1501 is individually arranged before the main analog-to-digital conversion unit 483 and the reference analog-to-digital conversion unit 482.

Figure 18:
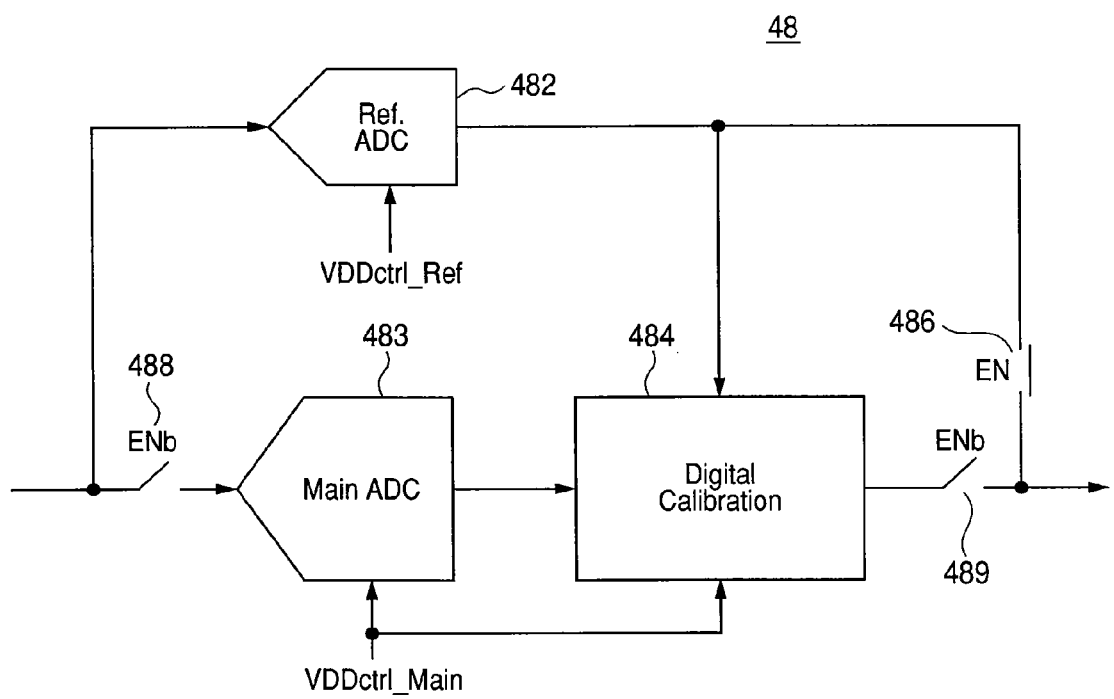
FIG. 18 is a view showing a configuration example of a digital calibration type analog-to-digital converter according to another embodiment of the present invention.

FIG. 18 shows an example of the analog-to-digital converter 48 when no sample and hold circuit are arranged.

Figure 19:
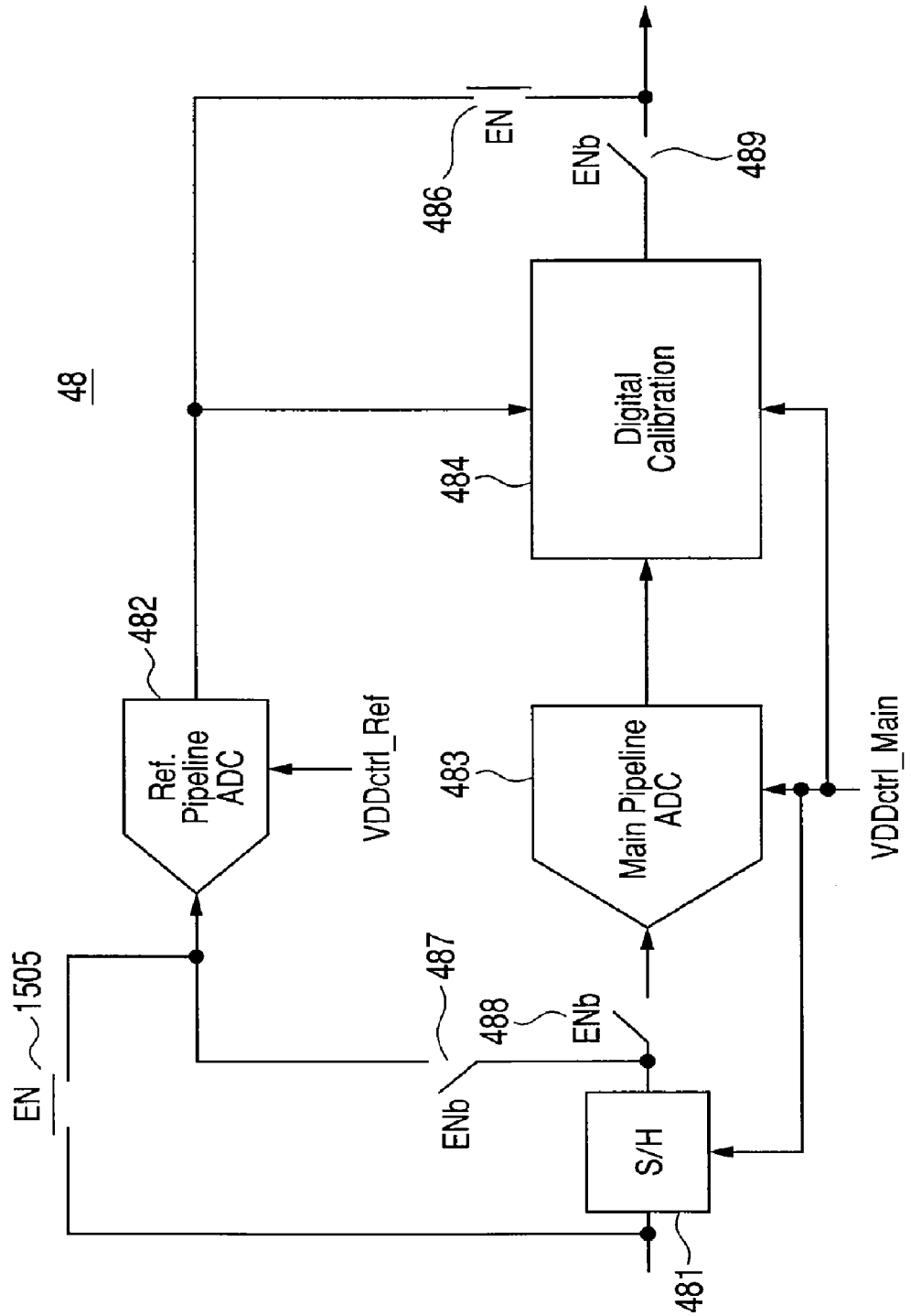
FIG. 19 is a view showing a configuration example of a digital calibration type analog-to-digital converter according to another embodiment of the present invention.

FIG. 19 shows an example of the analog-to-digital converter 48 when both the main analog-to-digital conversion unit 483 and the reference analog-to-digital conversion unit 482 in the configuration of FIG. 7 are implemented by a pipelined analog-to-digital conversion unit.

Figure 20:
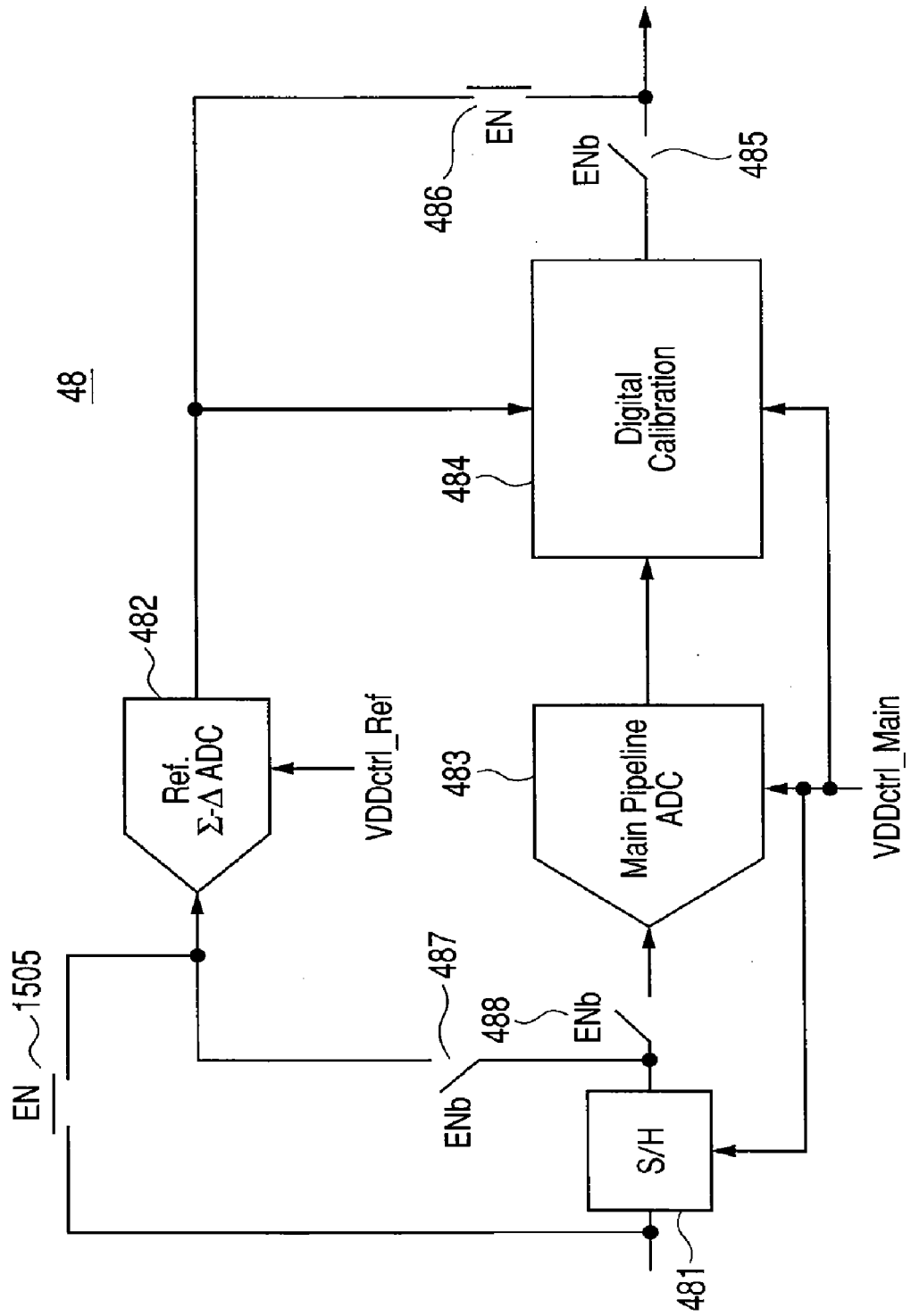
FIG. 20 is a view showing a configuration example of a digital calibration type analog-to-digital converter according to another embodiment of the present invention.

FIG. 20 shows a case where the main analog-to-digital conversion unit 483 is implemented by a pipelined analog-to-digital conversion unit and the reference analog-to-digital conversion unit 482 is implemented by a sigma delta type analog-to-digital conversion unit, in the configuration of FIG. 7. Further, the operations and effects of each of these embodiments are basically the same as those described in the example of FIG. 7 and therefore, the individually detailed description thereof is not repeated.

Eighth Embodiment

Figure 21:
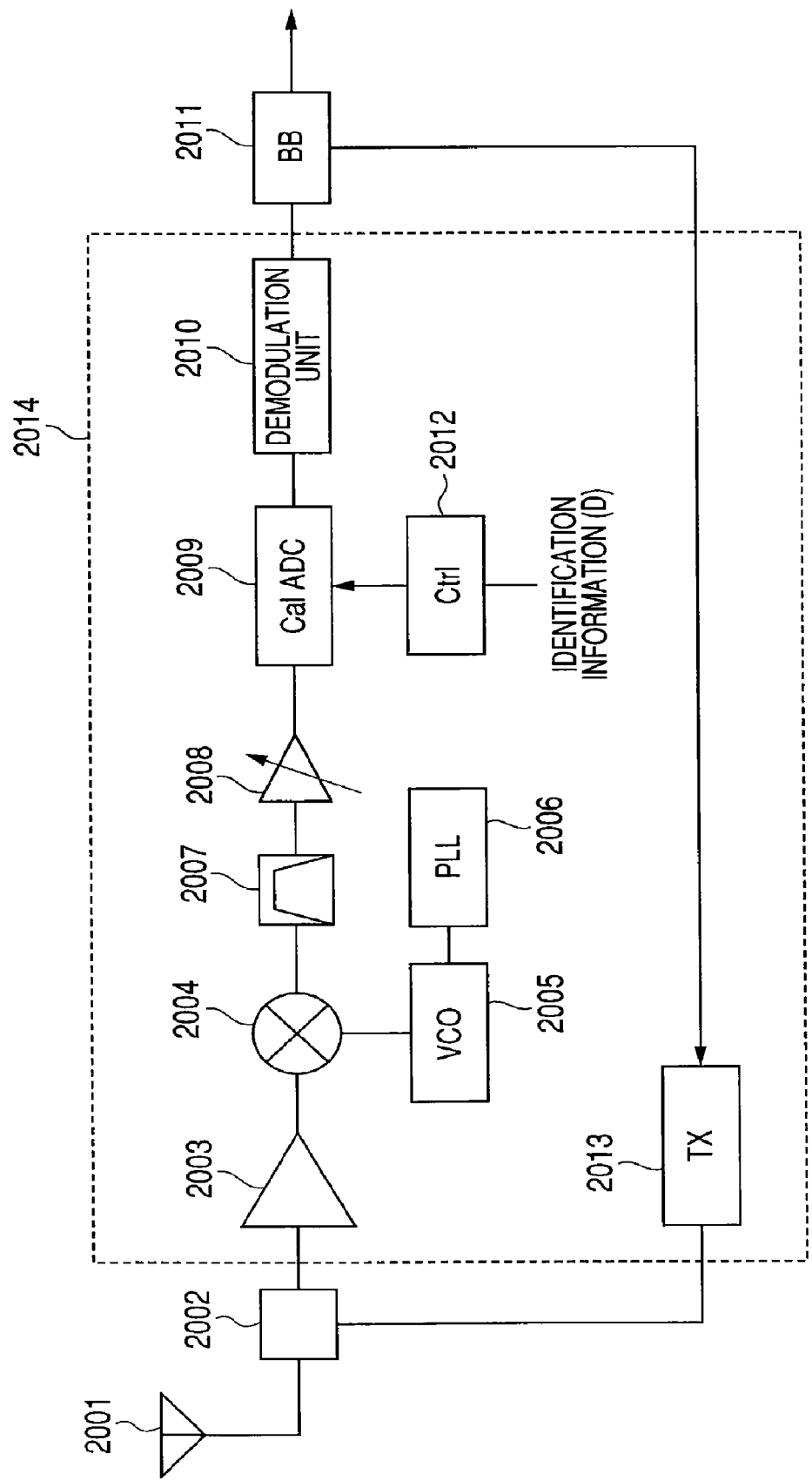
FIG. 21 is a view showing an entire circuit configuration of a transceiver circuit in a wireless transceiver circuit according to another embodiment of the present invention.

Next, the wireless transceiver circuit according to another embodiment of the present invention will be described. FIG. 21 shows an entire circuit configuration of a transceiver circuit in the wireless transceiver circuit according to the eighth embodiment. The eighth embodiment discloses a case where a transmitting and receiving unit except for the baseband signal processing unit in the circuit of the first embodiment, or the like is integrated on one chip.

In other words, in the eighth embodiment an RF-IC 2014, which includes a transmitting unit 2013 and a receiving unit except for a baseband signal processing unit 2011, is integrated on one chip by an IC. The receiving unit is installed with one digital calibration analog-to-digital converter 2009.

Signals received by an antenna 2001 are amplified in a high frequency amplification unit 2003 in the receiving unit via a transmitting and receiving switching unit 2002, which are in turn multiplied by local oscillation signals generated from a voltage controlled oscillator 2005 and a phase synchronization loop 2006 by means of a frequency conversion circuit 2004 to be frequency-converted into a low-intermediate frequency (or, zero frequency). Interference wave components of the intermediate frequency signal or the baseband signal are removed in a filter 2007, which are in turn amplified in a variable gain amplifier 2008 and input to a digital calibration type analog-to-digital converter 2009. In a high data rate, the digital calibration type analog-to-digital converter 2009 serves as the general digital calibration type analog-to-digital converter and in a low data rate, the reference analog-to-digital conversion unit included in the digital calibration type analog-to-digital converter 2009 performs an analog-to-digital conversion process, by a control signal provided from a switching control section 2012 on the basis of the identification information (D) that holds information, such as the kinds of currently received signals, data rate, or the like. At this time, the operation of the main analog-to-digital conversion unit, etc. is powered-down to stop, thereby reducing power consumption. In other words, in the Cal type analog-to-digital converter having the main analog-to-digital conversion unit and the reference analog-to-digital conversion unit, both the main analog-to-digital conversion unit and the reference analog-to-digital conversion unit are operated as the general Cal type analog-to-digital converter in a high data rate and in a low data rate, the operation of the main analog-to-digital conversion unit stops and the reference analog-to-digital conversion unit is instead operated, such that the one Cal type analog-to-digital converter can be operated corresponding to the dual rate.

A gain of the variable gain amplifier 2008 is automatically set so that amplitude of the output voltage of the variable gain amplifier is equal to or less than an input dynamic range of the digital calibration type analog-to-digital converter 2009. The signals digitized by the digital calibration type analog-to-digital converter 2009 are demodulated in a demodulation unit 2010, which are in turn subjected to an upper layer process by a baseband signal processing unit 2011 and output to a universal processor, or the like. The filter 2007 is implemented by a band pass filter based on an intermediate frequency when the intermediate frequency is not zero and is implemented by a low pass filter when the intermediate frequency is zero (a case of direct conversion).

A transmitting and receiving part 2014 can be integrated on one chip in a CMOS circuit or a BiCMOS circuit.

With the eighth embodiment, in a low sample rate, the operation of the main analog-to-digital conversion unit stops, such that a deterioration in operation characteristics of an RF circuit unit, an IF circuit unit, a modulation circuit, a demodulation circuit, and each circuit unit in a data processing unit, which is caused by a leakage of current or voltage having a high clock frequency to the above circuit units due to the coupling between the power supply lines or the wirings, or the like, can be avoided. Further, the reduction of the circuit area can be increased.

Ninth Embodiment

Although each of the foregoing embodiments describes the receiver circuit including one digital calibration type analog-to-digital converter, there may be a case where two digital calibration type analog-to-digital converters are used according to a configuration of the receiver circuit.

Figure 22:
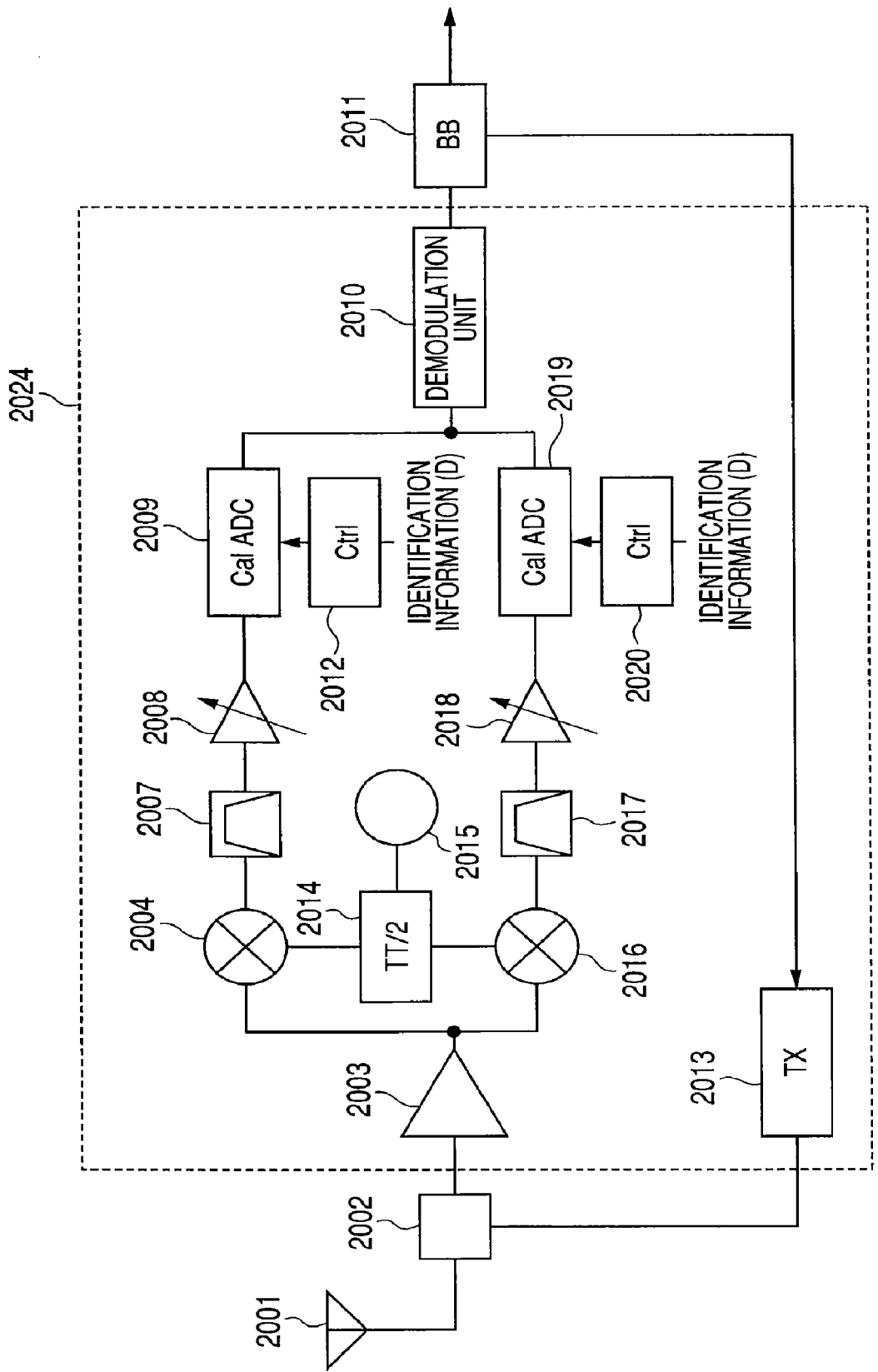
FIG. 22 is a view showing an entire circuit configuration of a transceiver circuit in a wireless transceiver circuit according to another embodiment of the present invention.

FIG. 22 shows an entire circuit configuration of a transceiver circuit in a wireless transceiver circuit according to another embodiment of the present invention. Unlike the circuit of the eighth embodiment, in the ninth embodiment, the receiving unit is installed with two digital calibration type analog-to-digital converters 2009 and 2109 that substantially have the same configuration. In the receiving unit, signals received by the an antenna are amplified in the high frequency amplification unit 2003 and are orthogonally-detect oscillation signals from a VCO 2015 and a 90° phase shifter 2014 by two mixers 2004 and 2005, which are in turn converted into I (In-phase)/Q (Quadrature-phase) signals. Interference wave components of the I/O signals are removed in filters 2007 and 2017, respectively, which are in turn amplified in a variable gain amplifier 2008 and 2018 and then converted into digital signals in the two digital calibration type analog-to-digital converters 2009 and 2109, respectively. The I/Q signals of the digital signals are input to a level detector (not shown) for performing an AGC control of variable gain amplifiers 2008 and 2018 and are demodulated by a demodulation unit 2010.

The present invention can be applied to a method that converts the received RF signals into the I/Q signals and then performs the analog-to-digital conversion, as described above.

The configuration and function of each digital calibration type analog-to-digital converter are the same as the above-mentioned embodiments. The effects of the ninth embodiment are the same as the eighth embodiment.

Tenth Embodiment

Figure 23:
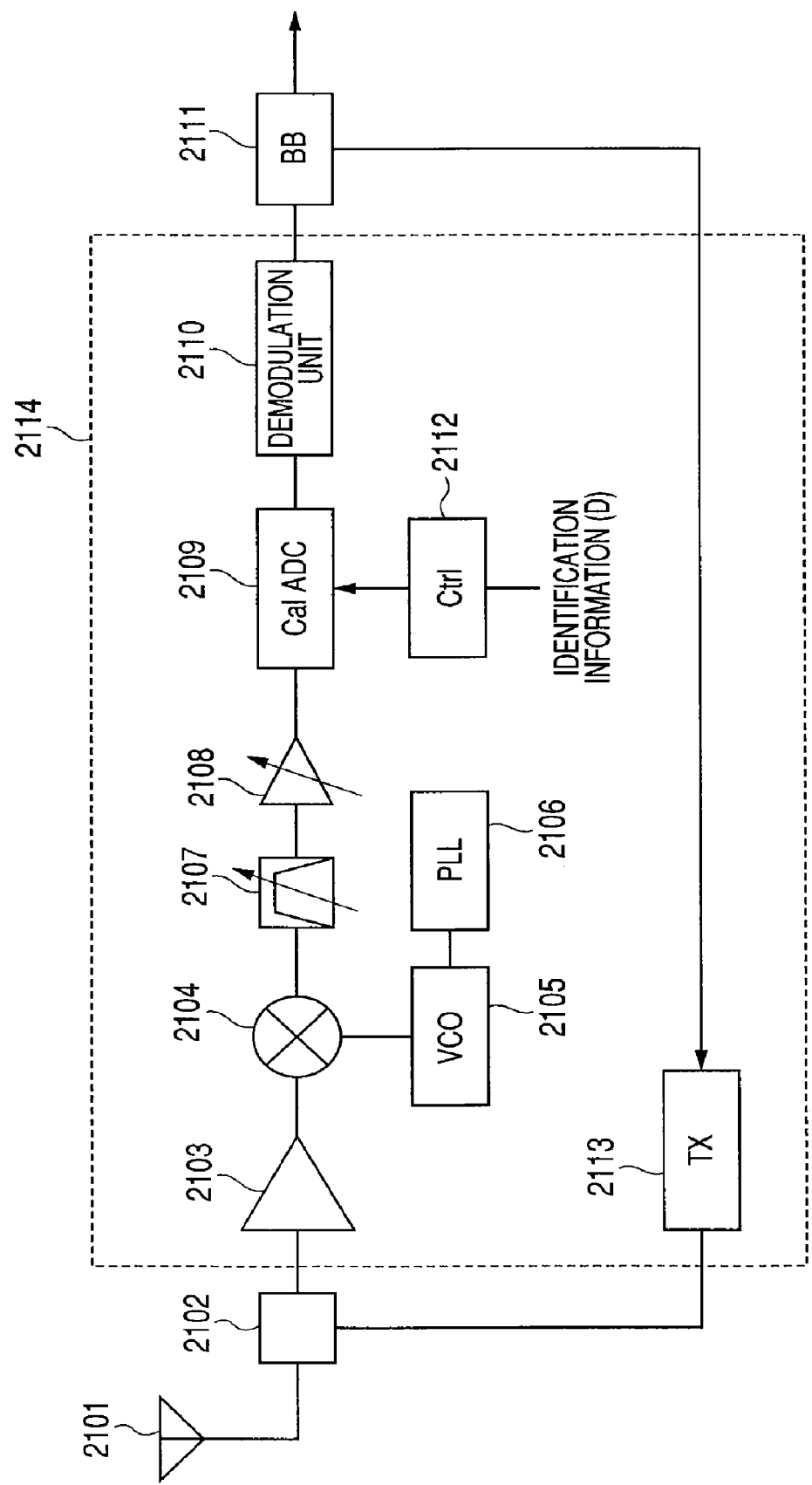
FIG. 23 is a view showing an entire circuit configuration of a transceiver circuit in a wireless transceiver circuit according to another embodiment of the present invention.
Figure 24:
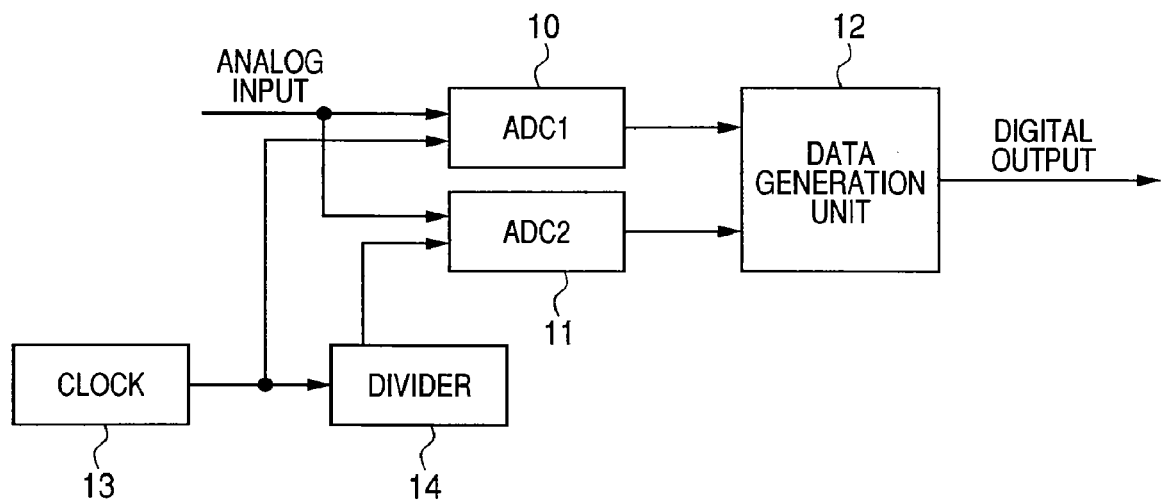
FIG. 24 is a view showing a general configuration example of a wireless receiving unit corresponding to a multi rate in the related art.
Figure 25:
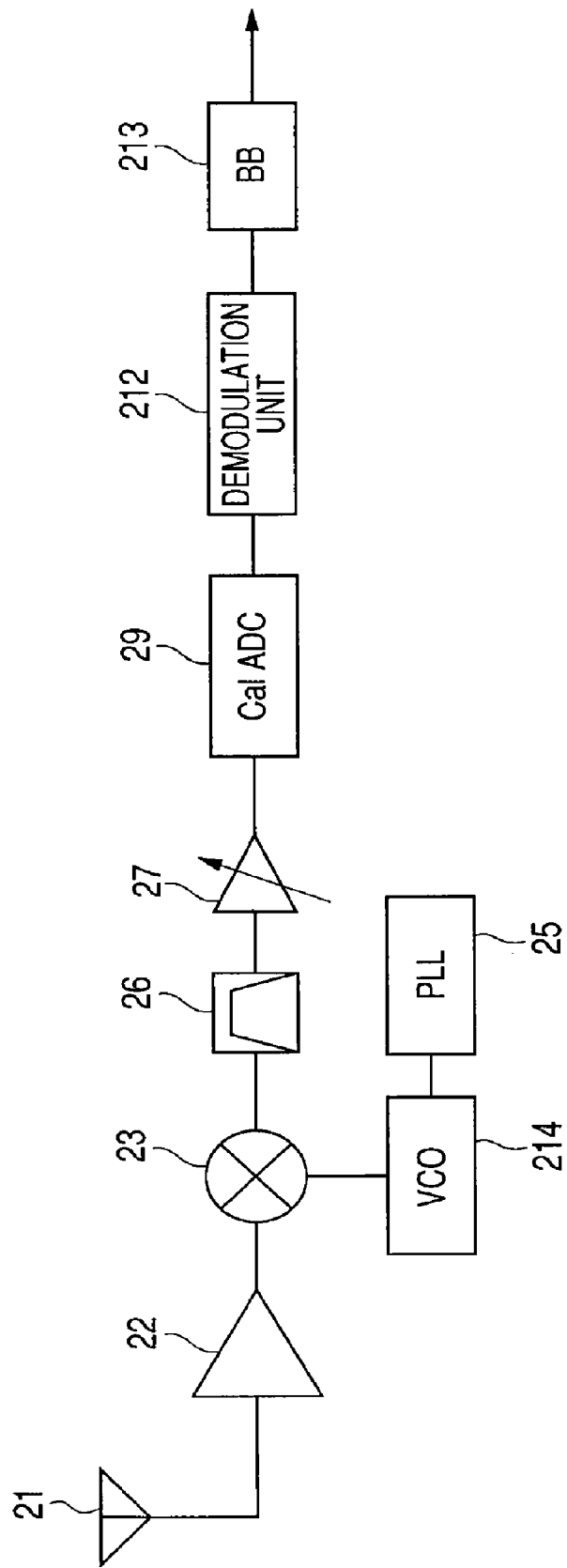
FIG. 25 is a view showing an entire circuit configuration example of a receiver circuit in a wireless transceiver circuit including a digital calibration type analog-to-digital converter in the related art.

A wireless transceiver circuit according to another embodiment of the present invention will be described. FIG. 23 shows an entire circuit configuration of a transceiver circuit in the wireless transceiver circuit according to the tenth embodiment. The tenth embodiment discloses a case where a transmitting and receiving unit including the baseband signal processing unit in the circuit of the first embodiment, or the like is integrated on one chip.

In other words, in the tenth embodiment, a transceiver 2114 including the receiving unit, the transmitting unit 2013, and the baseband signal processing unit 2011 can be integrated on one chip in a CMOS circuit or a BiCMOS circuit.

With the tenth embodiment, in the wireless circuit receiving the multi-rate data corresponding to the embodiment 8 or 9, in a low data rate, only the reference analog-to-digital conversion unit is operated, making it possible to reduce power consumption. At this time, the operation of the main analog-to-digital conversion unit stops, such that a deterioration in operation characteristics of the RF circuit unit, the IF circuit unit, the modulation circuit, the demodulation circuit, and each circuit unit in the data processing unit, which is caused by a leakage of current or voltage having a high clock frequency to the above circuit units due to the coupling between the power supply lines or the wirings, or the like, can be avoided. Further, the baseband signal processing unit 2011 is built in the chip, such that an interface for the output from the demodulation unit 2010 to the baseband signal processing unit 2011 can be simplified and the wiring length therebetween can be shortened, making it possible to reduce digital power consumption. Further, the baseband signal processing unit 2011 is built in the chip, such that it can perform a portion or all of an operation process in the digital calibration section 484, making it possible to reduce a chip area.

What is claimed is:
1. An A/D converter comprising;
a first A/D conversion unit;
a second A/D conversion unit;

a digital calibration section which calibrates an output of the first A/D conversion unit; and a controller which operates based on an information of input-signal identification, wherein the second A/D conversion unit performs A/D conversion with higher accuracy at slower sampling rate than the first A/D conversion unit, wherein when the information of input-signal identification indicates that an input signal to the A/D converter is a first signal, the controller controls in such a way that A/D conversion is performed by the first A/D conversion unit, the second A/D conversion unit and the digital calibration section, and A/D conversion result of the first signal is obtained from an output of the digital calibration section, and when the information of input-signal identification indicates that the input signal to the A/D converter is a second signal which has narrower bandwidth than the first signal, the controller controls in such a way that A/D conversion is performed by the second A/D conversion unit, and A/D conversion result of the second signal is obtained from an output of the second A/D conversion unit.

2. The A/D converter according to claim 1, wherein the first A/D conversion unit is a pipelined A/D converter.

3. The A/D converter according to claim 1, wherein the first A/D conversion unit is a successive approximation register A/D converter.

4. A wireless transceiver comprising:

a wireless transceiver circuit; and an A/D converter, wherein the A/D converter comprises a first A/D conversion unit, a second A/D conversion unit, a digital calibration section which calibrates an output of the first A/D conversion unit, and a controller which operates based on an information of input-signal identification, wherein the second A/D conversion unit performs A/D conversion with higher accuracy at slower sampling rate than the first A/D conversion unit, wherein when the information of input-signal identification indicates that an input signal to the A/D converter is a first signal, the controller controls in such a way that A/D conversion is performed by the first A/D conversion unit, the second A/D conversion unit and the digital calibration section, and A/D conversion result of the first signal is obtained from an output of the digital calibration section, and wherein when the information of input-signal identification indicates that the input signal to the A/D converter is a second signal which corresponds to slower data rate than the first signal, the controller controls in such a way that A/D conversion is performed by the second A/D conversion unit, and A/D conversion result of the second signal is obtained from an output of the second A/D conversion unit.

5. A medical apparatus comprising:

a sensor section;

an analog front-end circuit; and an A/D converter, wherein the A/D converter comprises a first A/D conversion unit, a second A/D conversion unit, a digital calibration section which calibrates an output of the first A/D conversion unit, and a controller which operates based on an information of input-signal identification, wherein the second A/D conversion unit performs A/D conversion with higher accuracy at slower sampling rate than the first A/D conversion unit, wherein when the information of input-signal identification indicates that the input signal to the A/D converter is a first signal, the controller controls in such a way that A/D conversion is performed by the first A/D conversion unit, the second A/D conversion unit and the digital calibration section, and A/D conversion result of the first signal is obtained from an output of the digital calibration section, and wherein when the information of input-signal identification indicates that the input signal to the A/D converter is a second signal which has narrower bandwidth than the first signal, the controller controls in such a way that A/D conversion is performed by the second A/D conversion unit, and A/D conversion result of the second signal is obtained from an output of the second A/D conversion unit.

* * * * *